(12) United States Patent
Yang et al.

(10) Patent No.: US 12,148,478 B2
(45) Date of Patent: Nov. 19, 2024

(54) ERASE METHOD FOR NON-VOLATILE MEMORY WITH MULTIPLE TIERS

(71) Applicant: SanDisk Technologies LLC, Addison, TX (US)

(72) Inventors: Xiang Yang, Santa Clara, CA (US); Masaaki Higashitani, Cupertino, CA (US); Abhijith Prakash, Milpitas, CA (US); Dengtao Zhao, Los Gatos, CA (US)

(73) Assignee: SanDisk Technologies LLC, Austin, TX (US)

( * ) Notice: Subject to any disclaimer, the term of this patent is extended or adjusted under 35 U.S.C. 154(b) by 179 days.

(21) Appl. No.: 17/952,846

(22) Filed: Sep. 26, 2022

(65) Prior Publication Data

US 2024/0105265 A1 Mar. 28, 2024

(51) Int. Cl.
| | |
|---|---|
| *G11C 16/14* | (2006.01) |
| *G11C 16/04* | (2006.01) |
| *G11C 16/34* | (2006.01) |
| H01L 25/065 | (2023.01) |

(52) U.S. Cl.
CPC .......... *G11C 16/14* (2013.01); *G11C 16/0483* (2013.01); *G11C 16/3445* (2013.01); *H01L 25/0657* (2013.01); *H01L 2225/06562* (2013.01)

(58) Field of Classification Search
CPC ...................................................... G11C 16/14
USPC .................................................... 365/185.29
See application file for complete search history.

(56) References Cited

U.S. PATENT DOCUMENTS

| | | | |
|---|---|---|---|
| 7,804,718 | B2 | 9/2010 | Kim |
| 9,620,217 | B2 | 4/2017 | Lue et al. |
| 10,902,922 | B2 | 1/2021 | Seo et al. |
| 2014/0063938 | A1* | 3/2014 | Oh ...................... G06F 12/0246 365/185.11 |
| 2019/0074061 | A1 | 3/2019 | Ghodsi |
| 2020/0381058 | A1 | 12/2020 | Lee et al. |
| 2021/0082506 | A1 | 3/2021 | Chibvongodze et al. |
| 2021/0174887 | A1* | 6/2021 | Sanada ............. G11C 16/0483 |
| 2021/0391012 | A1 | 12/2021 | Masuduzzaman et al. |
| 2022/0180933 | A1 | 6/2022 | Tang et al. |

* cited by examiner

*Primary Examiner* — Hoai V Ho
(74) *Attorney, Agent, or Firm* — Vierra Magen Marcus LLP

(57) ABSTRACT

A non-volatile memory system comprises a plurality of non-volatile memory cells divided into three or more tiers. The memory cells can be programmed, erased and read. In order to achieve uniform erase speed for the three or more tiers, the erase process comprises applying a larger voltage bias to control gates of non-volatile memory cells in the outer tiers than the voltage bias applied to control gates of non-volatile memory cells in one or more inner tiers.

12 Claims, 27 Drawing Sheets

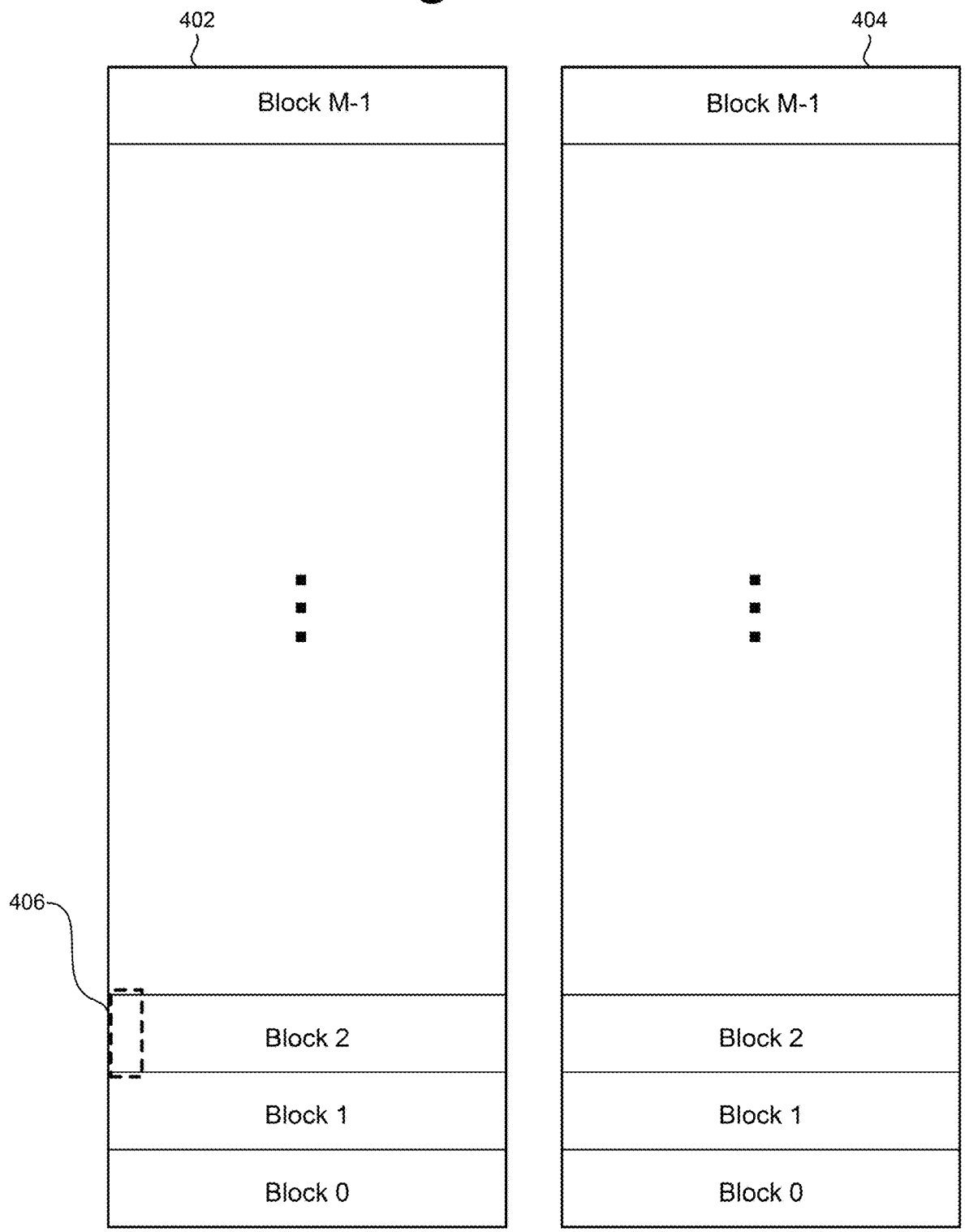

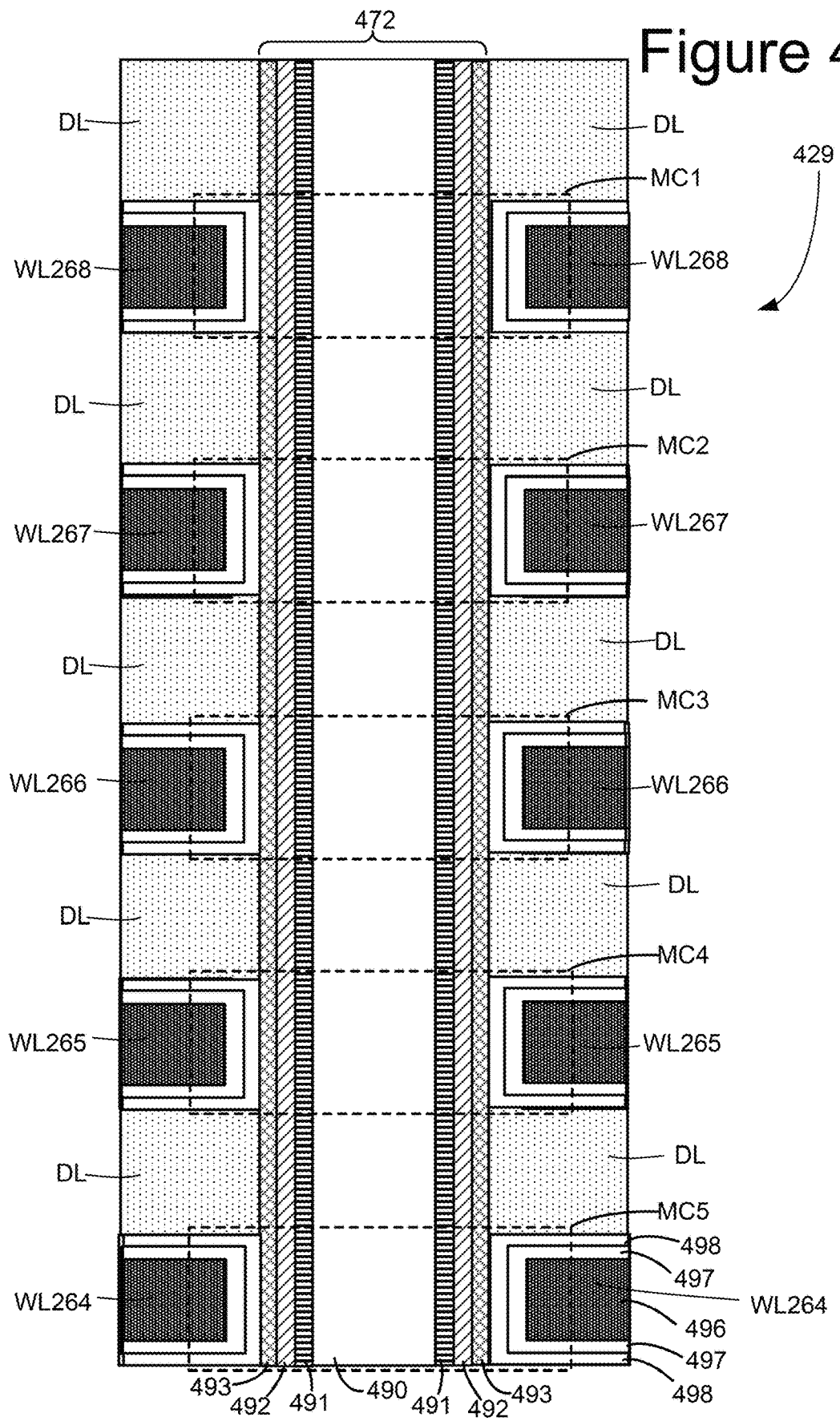

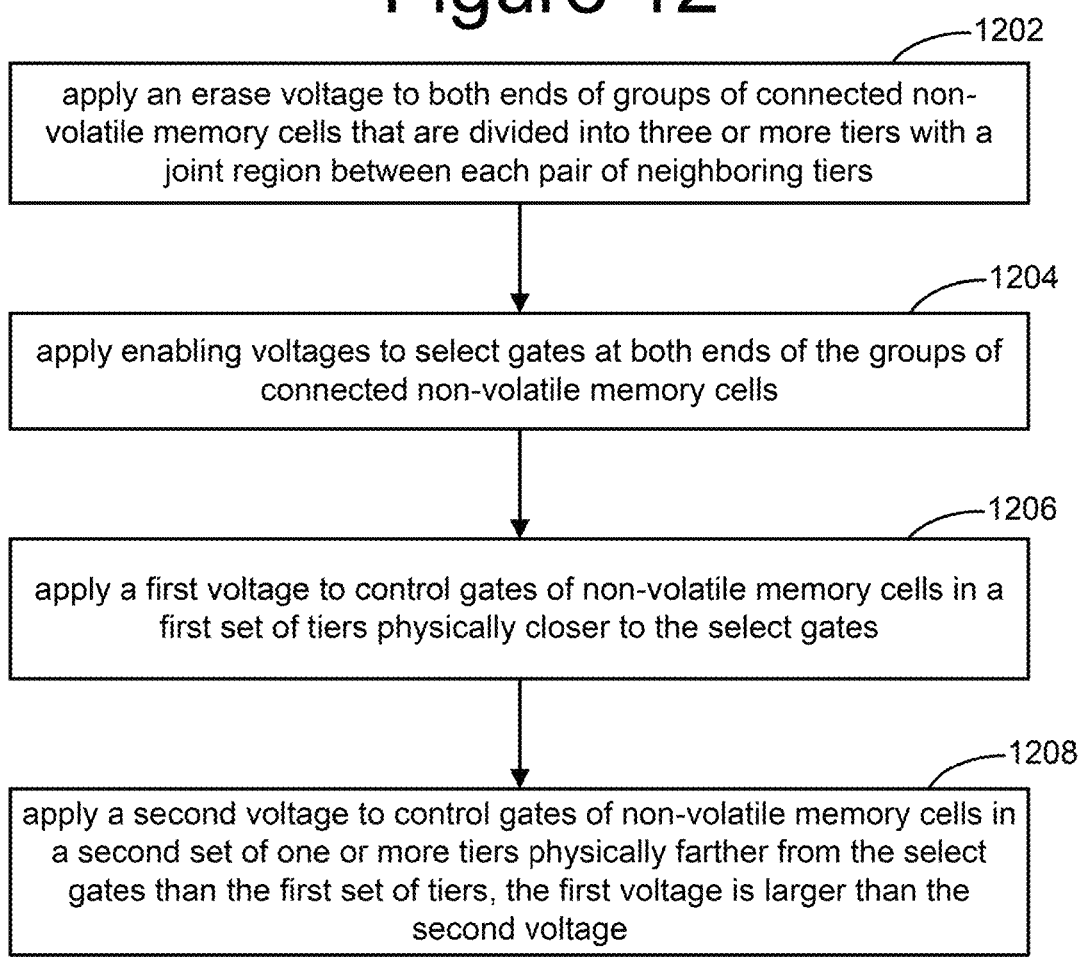

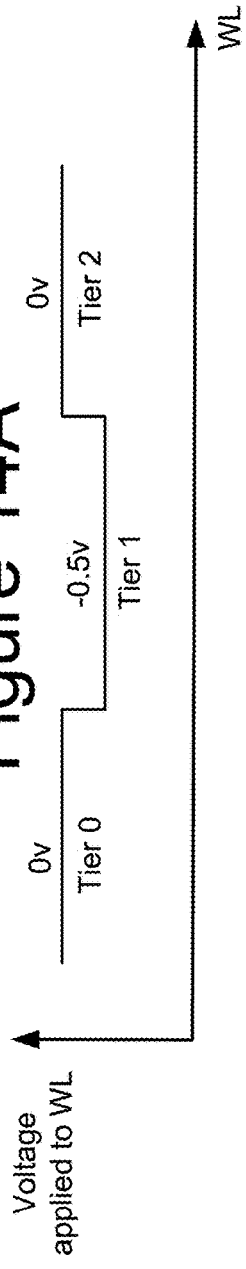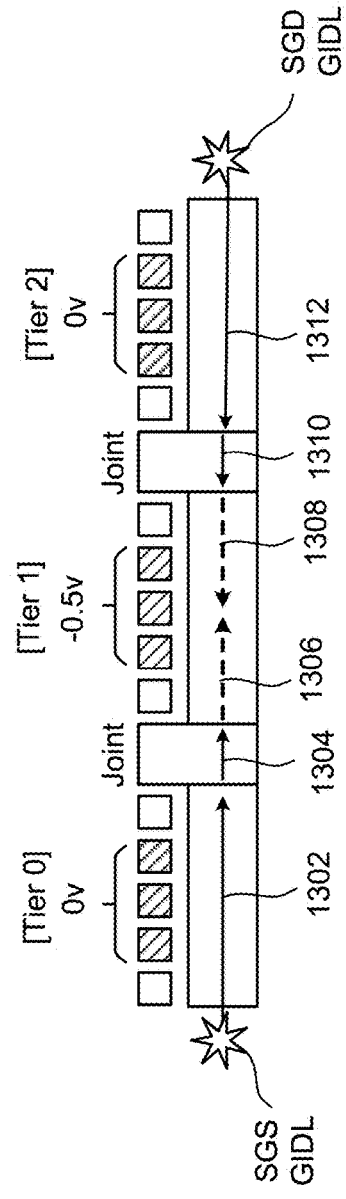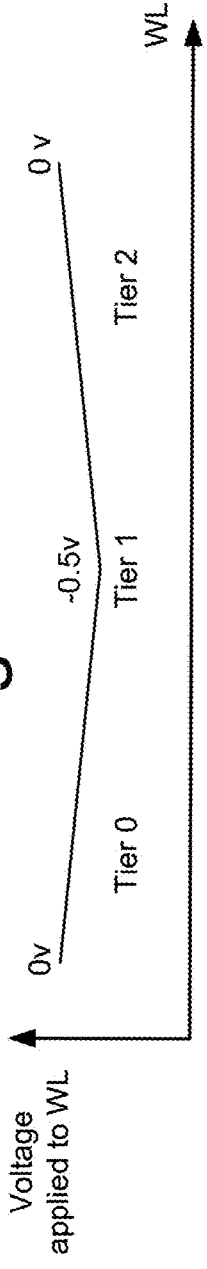

ERASE METHOD FOR NON-VOLATILE MEMORY WITH MULTIPLE TIERS

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Users of non-volatile memory can program (i.e., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIG. 4A is a block diagram of one embodiment of a memory structure having two planes.

FIG. 4F is a cross sectional view of one embodiment of a vertical column of memory cells.

FIG. 12 is a flow chart describing one embodiment of a process for concurrently erasing three or more tiers including compensating for intrinsic erase speed differences between the tiers to achieve uniform erase speed for the three or more tiers.

FIG. 14A depicts a graph of word line voltage versus word line position.

FIG. 14B depicts three tiers of a memory hole.

FIG. 14C depicts a graph of word line voltage versus word line position.

DETAILED DESCRIPTION

Because there is a limit regarding the maximum height/depth that can be etched reliably, some non-volatile memories are fabricated as multiple tiers. However, it has been determined that in systems with three or more tiers, some tiers erase at slower speeds than other tiers, which can lead to issues with device reliability. Therefore, in order to achieve uniform erase speed for three or more tiers, the erase process comprises applying a larger voltage bias to control gates of non-volatile memory cells in the outer tiers than the voltage bias applied to control gates of non-volatile memory cells in one or more inner tiers. More details are provided below.

Figure 1:
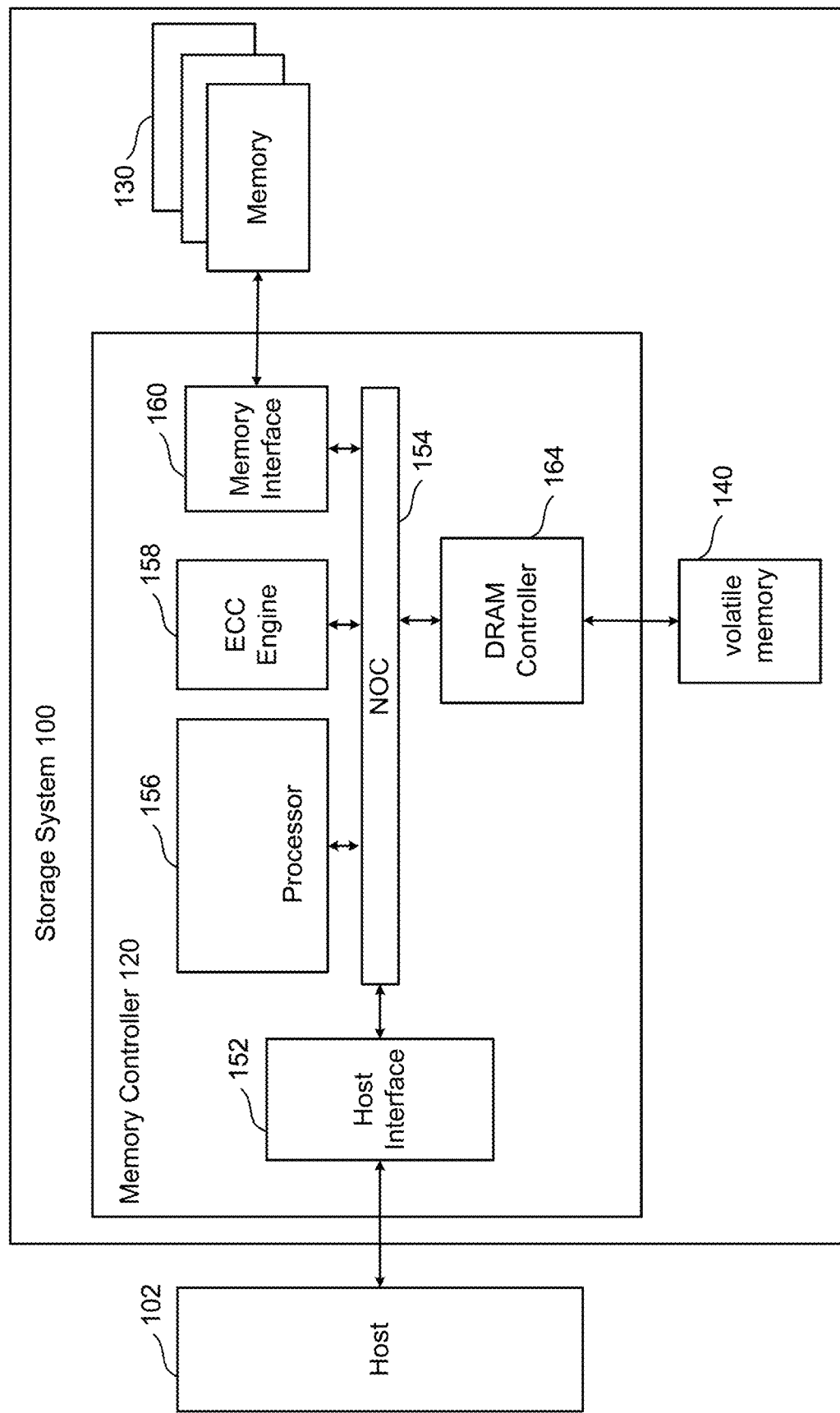
FIG. 1 is a block diagram depicting one embodiment of a storage system.

FIG. 1 is a block diagram of one embodiment of a non-volatile storage system 100 that implements the proposed technology described herein. In one embodiment, non-volatile storage system 100 is a solid state drive ("SSD"). Non-volatile storage system 100 can also be a memory card, USB drive or other type of storage system.

The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
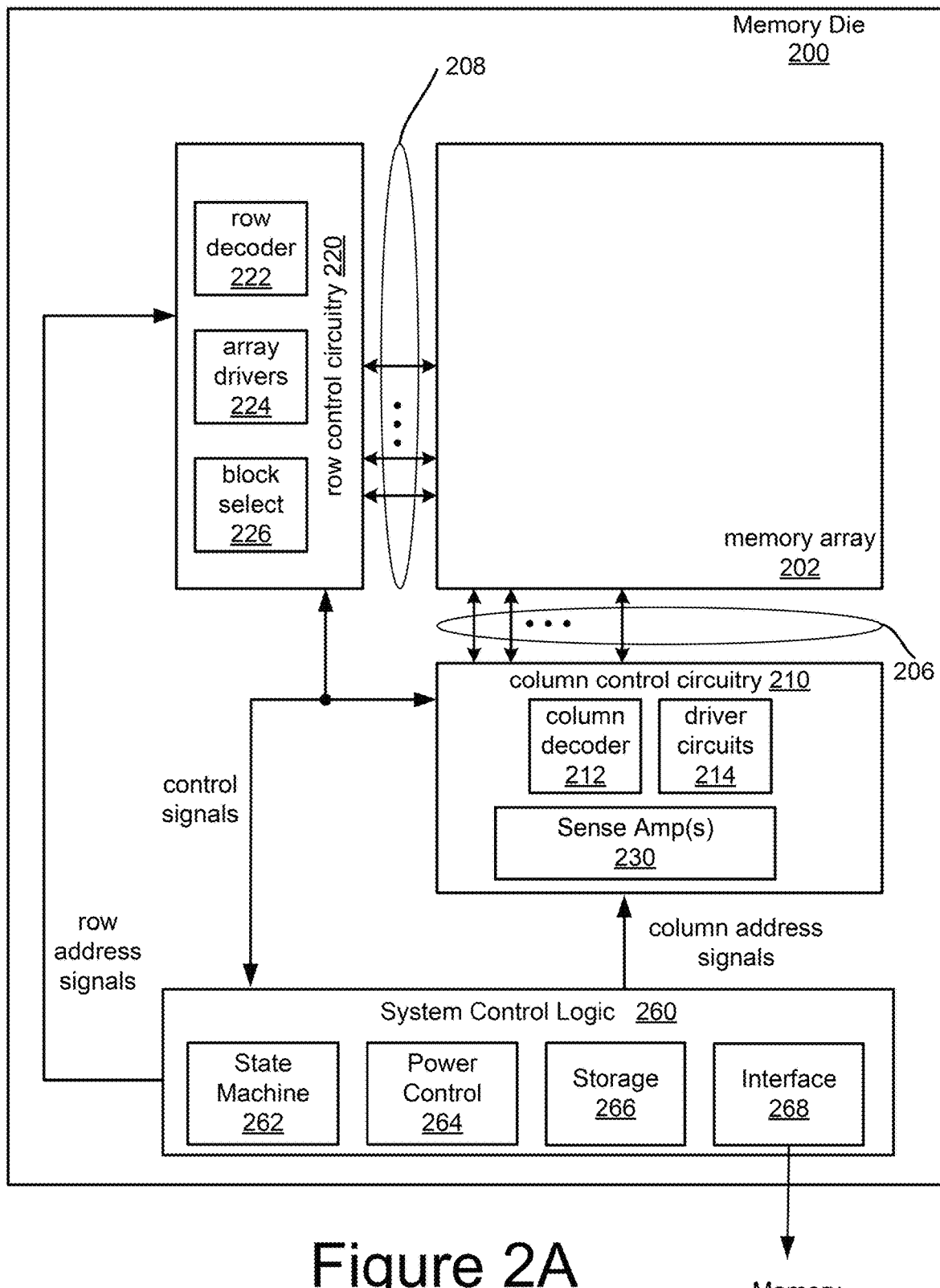
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ CMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
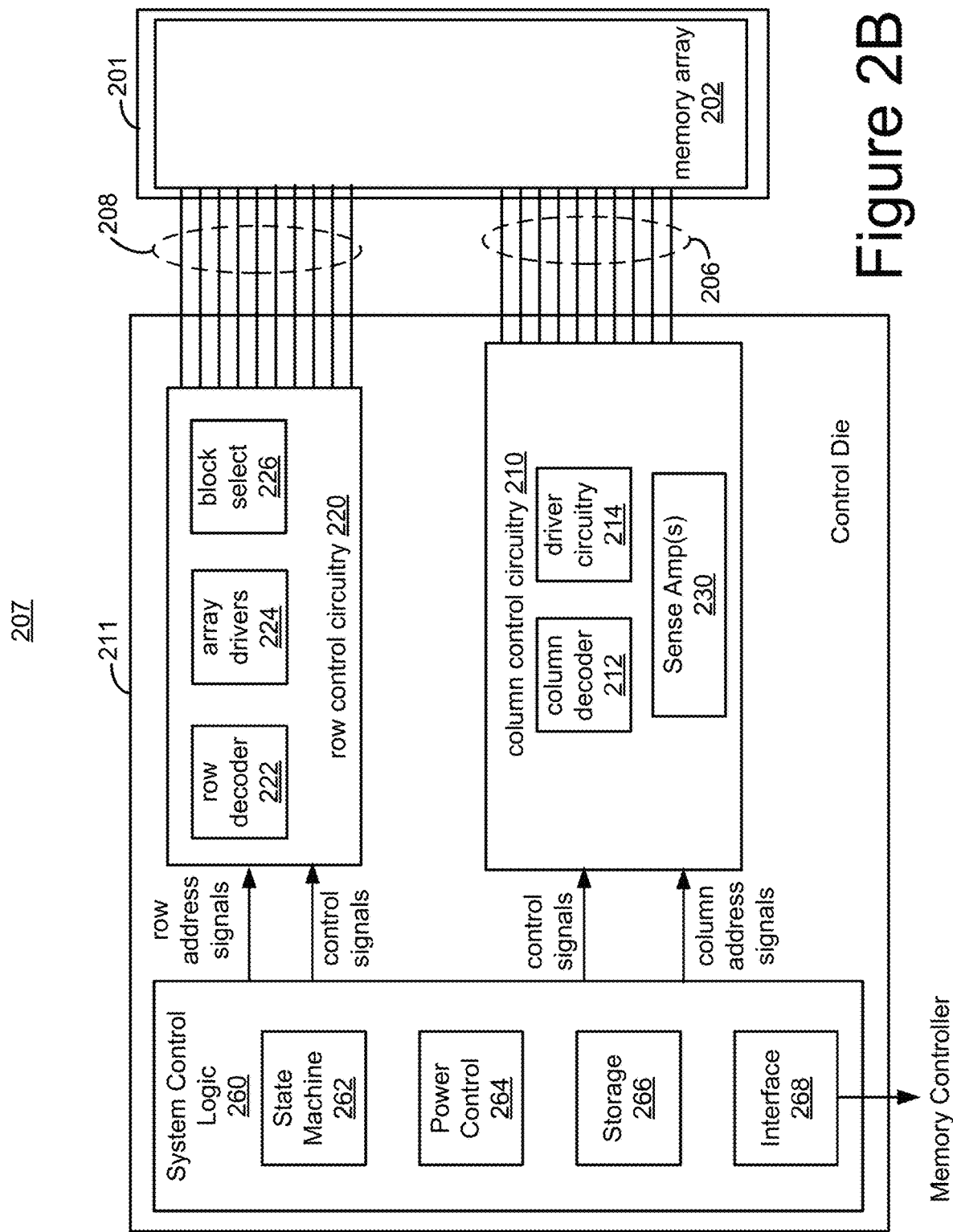
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201.

In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212 and driver circuitry 214, and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
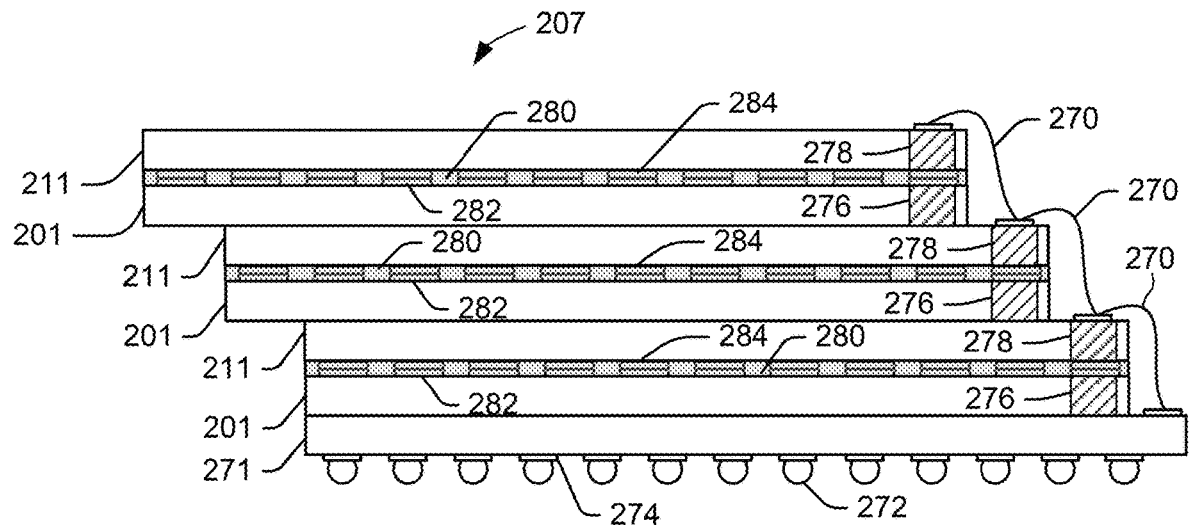
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
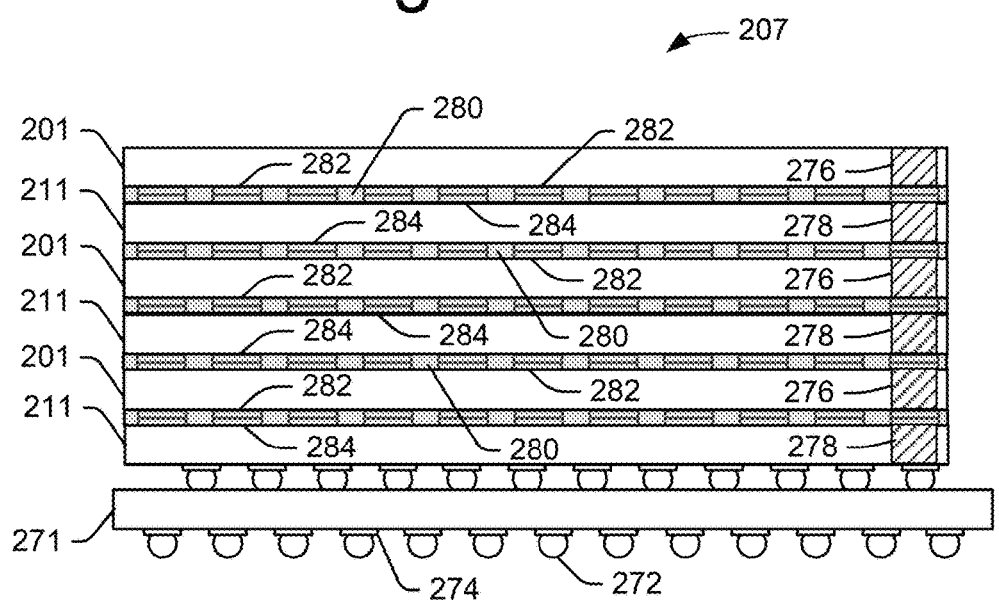

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
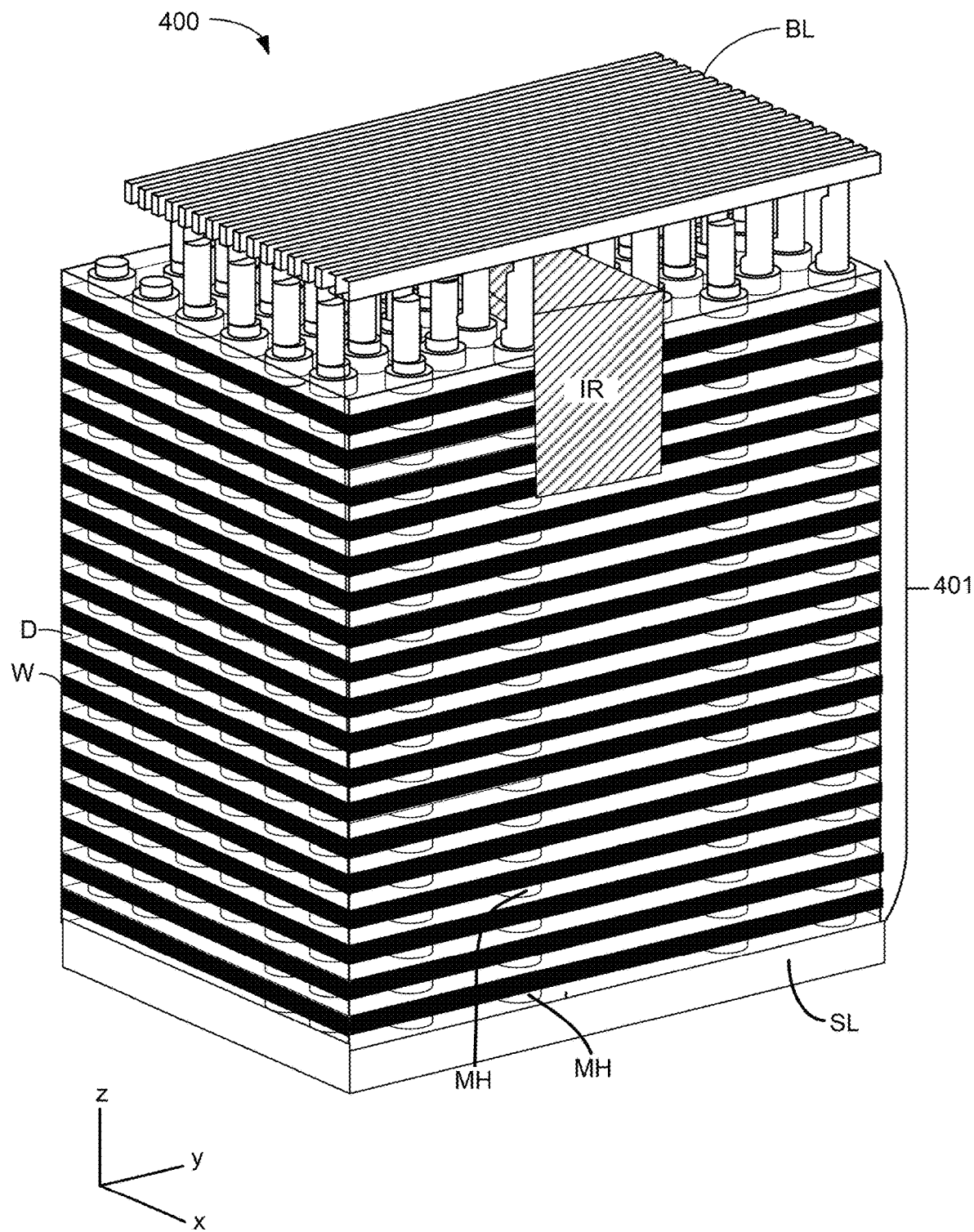
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions by isolation regions IR. These regions are sometimes referred to as fingers or strings. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all the vertical NAND strings for that block. Although FIG. 4A shows two planes 402/404, more or less than two planes can be implemented. In some embodiments, memory structure 202 includes four planes, eight planes or more than eight planes.

Figure 4B:
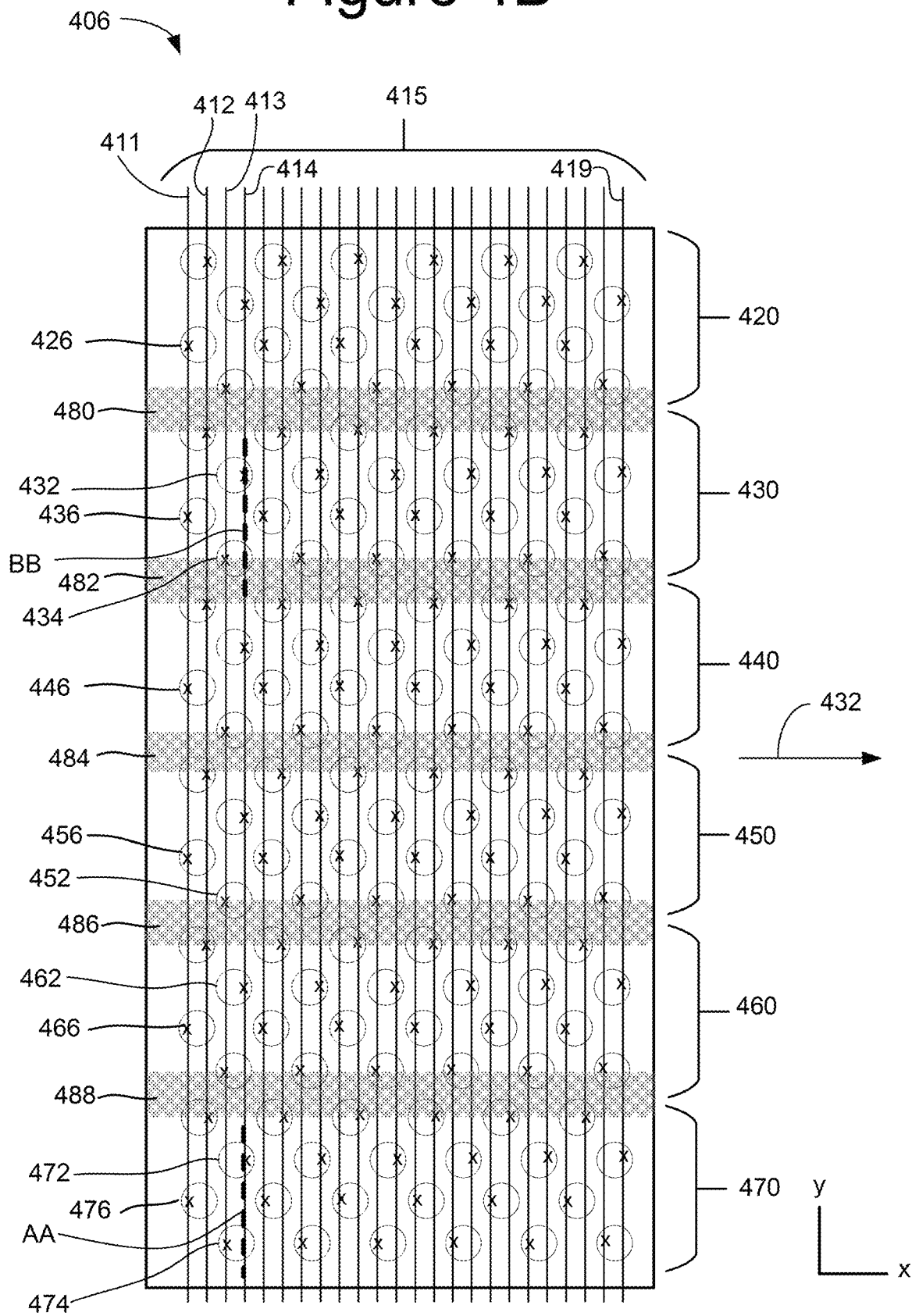
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, ... 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of SiO$_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470. In one embodiment, the isolation regions only divide the layers used to implement select gates (e.g., SGD) so that NAND strings in different regions can be independently selected. In one example implementation, a bit line only connects to one vertical column/NAND string in each of regions 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines (SGD) to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
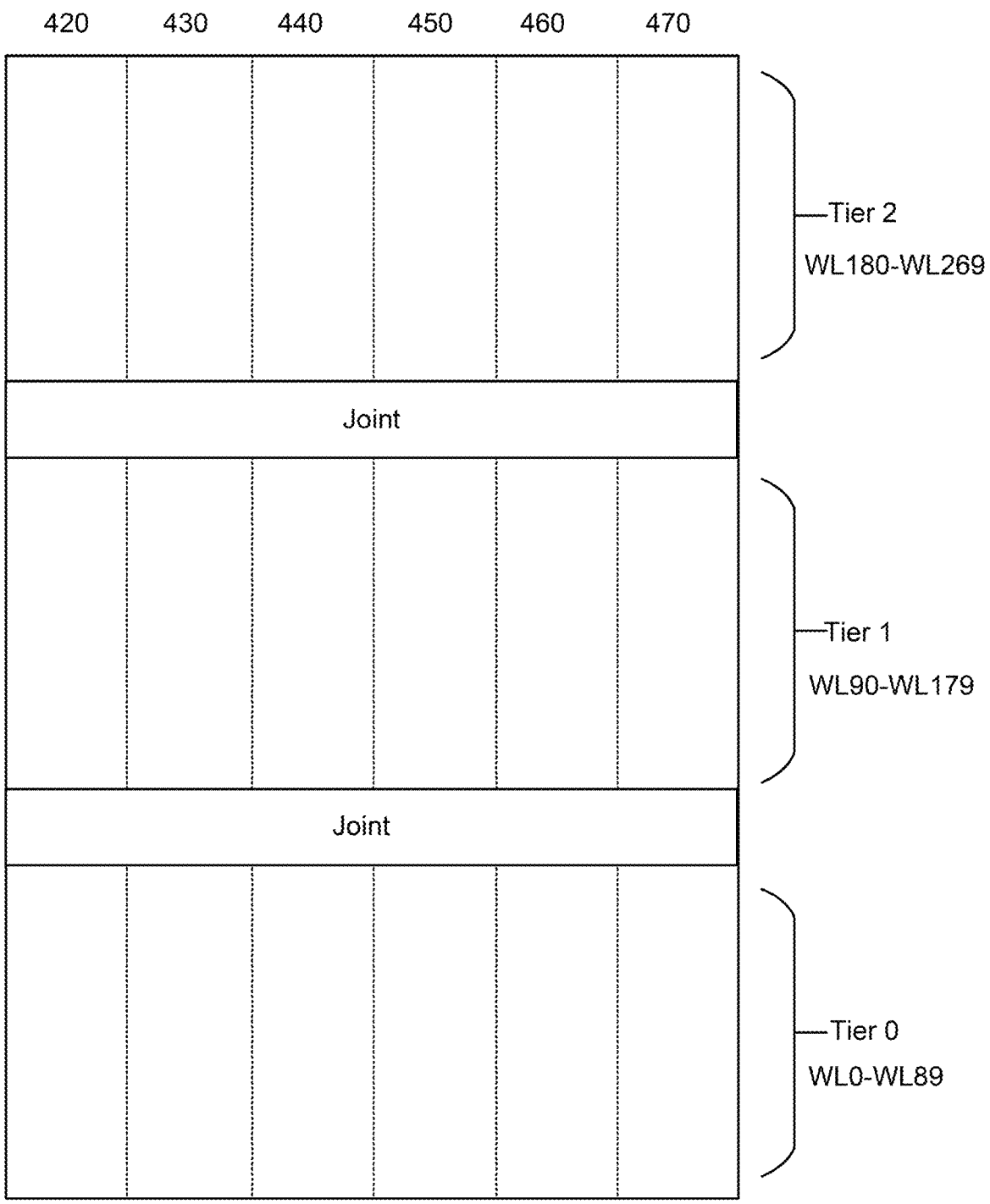
FIG. 4C depicts a cross sectional view of a portion of one embodiment of a block of memory cells.

FIG. 4C depicts a side view of portion 406 of Block 2 of plane 402, that is also depicted in FIG. 4B. The side view of FIG. 4C shows that the memory array is implemented as a three tier architecture, with each tier separate by a Joint region. The first tier (Tier 0) comprises word lines WL0-WL89. The second tier (Tier 1) comprises word lines WL90-WL179. The third tier (Tier 2) comprises word lines WL180-WL269. In other embodiments, a block has more than three tiers.

Figure 4D:
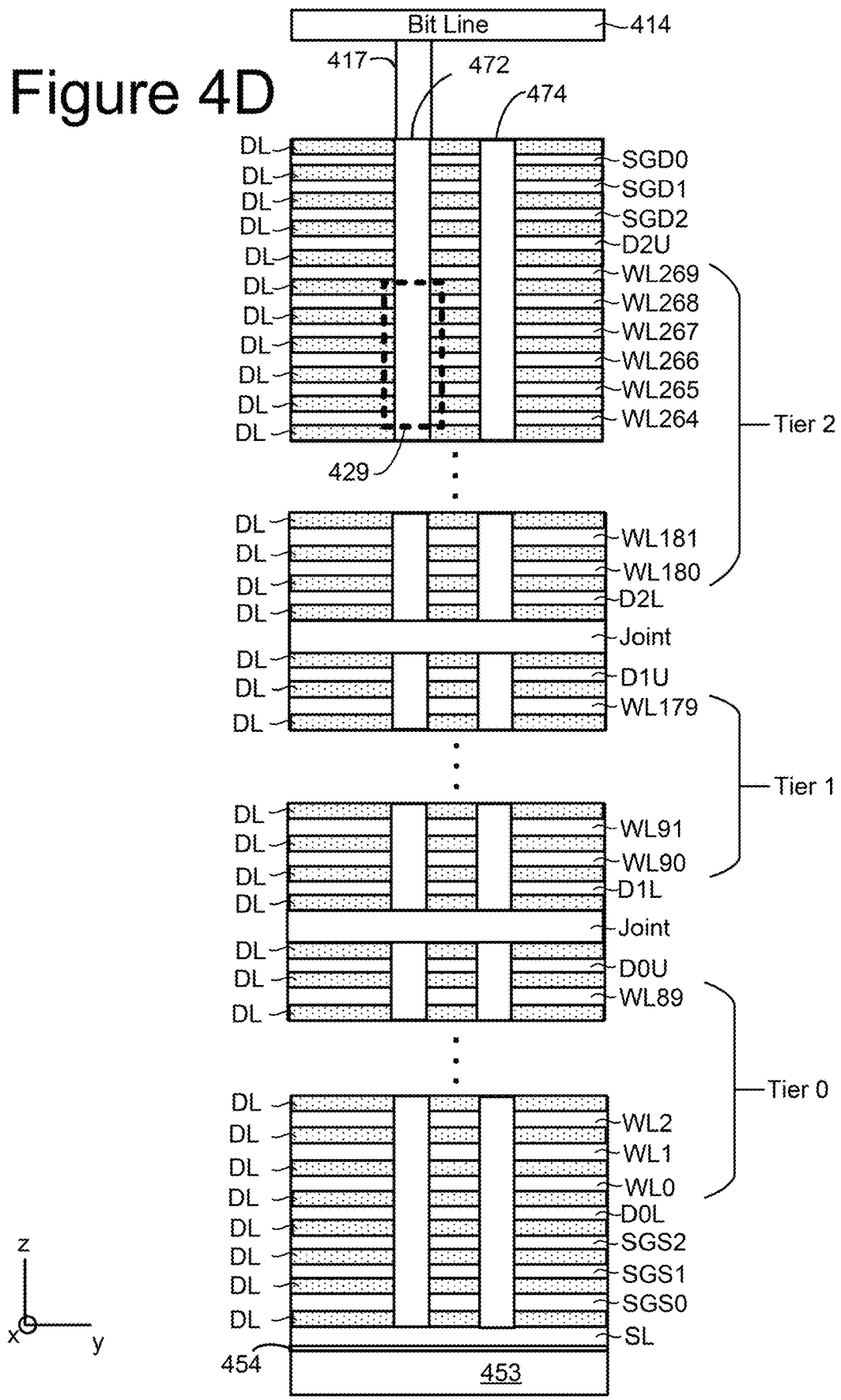
FIG. 4D depicts a cross sectional view of a portion of one embodiment of a block of memory cells.

FIG. 4D depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4D includes three drain side select layers SGD0, SGD1 and SGD2 (that form select lines); three source side select layers SGS0, SGS1, and SGS2 (that form select lines); dummy word line layers D0L, D0U, D1L, D1I, D2L and D2U for connecting to dummy memory cells (that do not store data from a host); two hundred and seventy data word line layers WL0-WL269 for connecting to data memory cells (that store data), and dielectric layers DL. Other embodiments can implement more or less than the numbers described above for FIG. 4D. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 472 has a source end at a bottom of the stack and a drain end at a top of the stack. As in agreement with FIG. 4B, FIG. 4D shows vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL. In one embodiment, the dielectric layers are made from SiO$_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings to form a block having three tiers Tier 0, Tier 1 and Tier 2. The word line layers WL0-W269 connect to memory cells (also called data memory cells). Each NAND string of the block includes memory cells in each of the three tiers; for example, memory cells connected to word lines WL0-WL89 are in Tier 0, memory cells connected to word lines WL90-WL179 are in Tier1, and memory cells connected to word lines WL180-WL269 are in Tier 2. Dummy word line layers connect to dummy memory cells. A dummy memory cell does not store and is not eligible to store host data (data provided from the host or entity outside of the storage system 100), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

FIG. 4D also shows two Joint regions. In one embodiment it is expensive and/or challenging to etch so many word line layers intermixed with dielectric layers. To ease this burden, one embodiment includes laying down a first stack of word line layers alternating with dielectric layers (e.g., for Tier 0), laying down the lower Joint region, laying down a second stack of word line layers alternating with dielectric layers (e.g., for Tier 1), laying down the upper Joint area, and laying down a third stack of word line layers alternating with dielectric layers (e.g., for Tier 2). The Joint regions are positioned between the first stack and the second stack, and between the second stack and the third stack. In one embodiment, the Joint regions are made from the polysilicon. The Joint regions serves as a buffer layer allowing some misalignment between an upper tier and a lower tier.

Figure 4E:
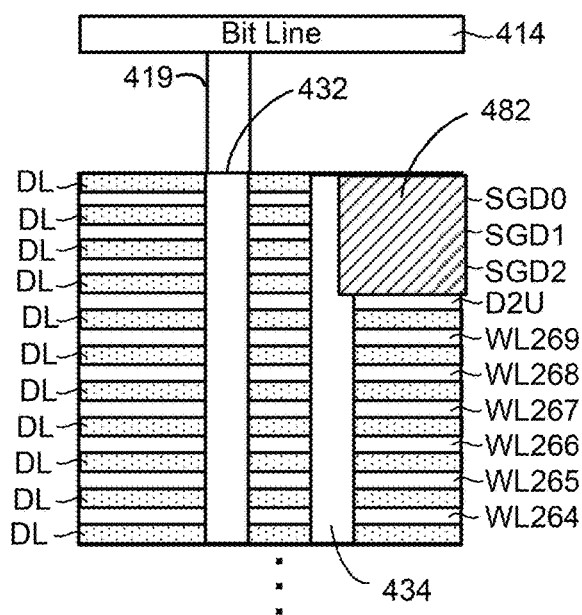
FIG. 4E depicts a cross sectional view of a portion of one embodiment of a block of memory cells.

FIG. 4E depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4E shows the same alternating conductive and dielectric layers as FIG. 4D. FIG. 4E also shows isolation region 482. Isolation regions 480, 482, 484, 486 and 488) occupy space that would have been used for a portion of the memory holes/vertical columns/NAND strings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, and SGD2 has a semicircular cross section. In one embodiment, after the stack of alternating conductive and dielectric layers is formed, the stack is etched to create space for the isolation region and that space is then filled in with $SiO_2$.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DL, as well as word line layers WL264, WL265, WL266, WL267, and WL268. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL268 and a portion of vertical column 472 comprise a memory cell MC1. Word line layer WL267 and a portion of vertical column 472 comprise a memory cell MC2. Word line layer WL266 and a portion of vertical column 472 comprise a memory cell MC3. Word line layer WL265 and a portion of vertical column 472 comprise a memory cell MC4. Word line layer WL264 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
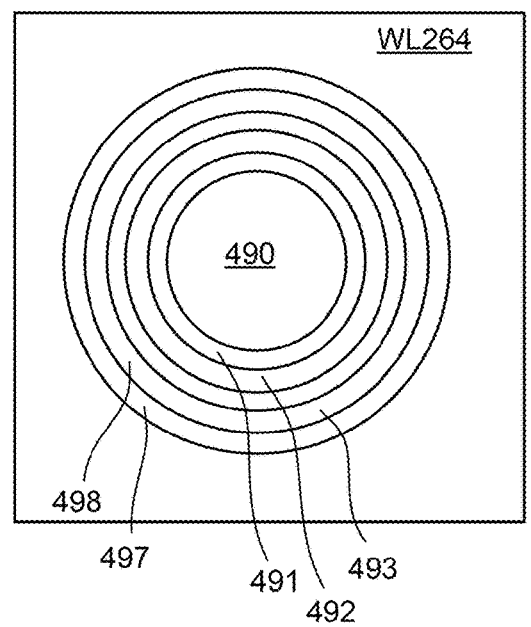
FIG. 4G depicts a cross section of as memory hole that implements a vertical NAND string.

FIG. 4G shows a cross section of vertical column 472 of FIG. 4F, cut through MC5. Thus, FIG. 4G depicts word line layer WL264, inner core 490, channel 491, tunneling dielectric 492, charge trapping layer 493, aluminum oxide layer 497, and blocking oxide layer 498.

Figure 4H:
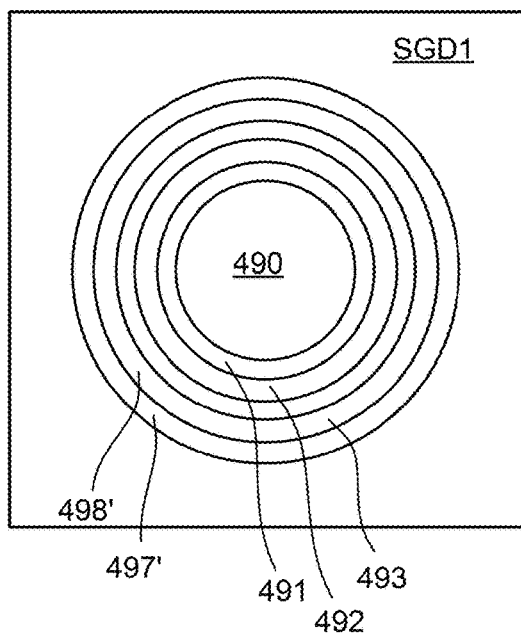
FIG. 4H depicts a cross section of as memory hole that implements a vertical NAND string.

FIG. 4H shows a cross section of vertical column 472 cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
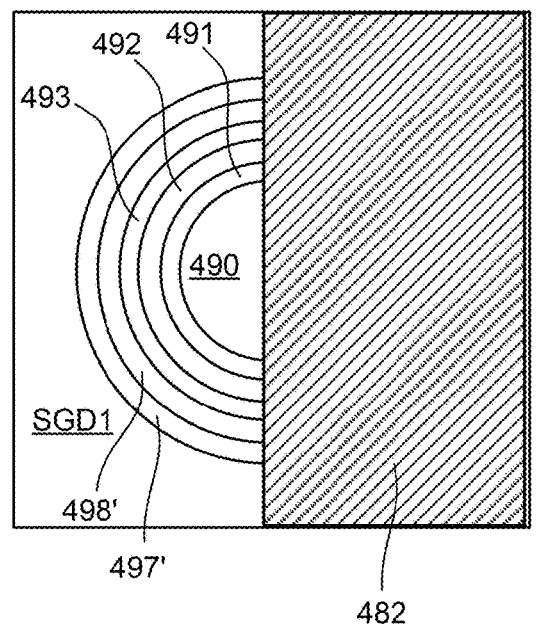
FIG. 4I depicts a cross section of as memory hole that implements a vertical NAND string.

FIG. 4I shows a cross section of vertical column 434 cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer) of vertical column 434 is semicircular in shape (or partially circular in shape) due to vertical column (NAND string) 434 intersecting isolation region 482.

Figure 4J:
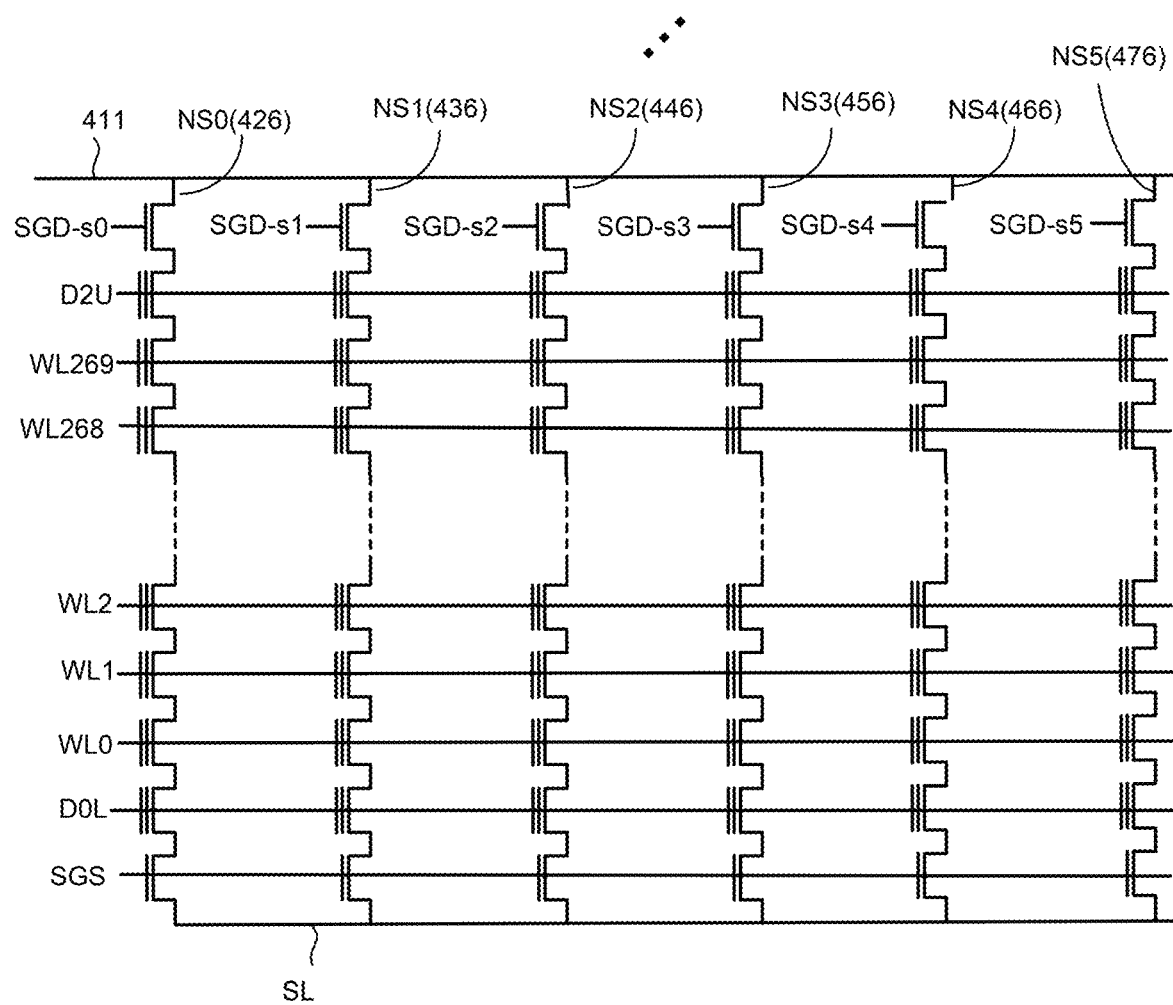
FIG. 4J is a schematic of a plurality of NAND strings.

FIG. 4J is a schematic diagram of a portion of the memory array 202 depicted in in FIGS. 4-4I. FIG. 4J shows physical data word lines WL0-WL269 running across the block. The structure of FIG. 4J corresponds to a portion 406 in Block 2 of FIG. 4A, including bit line 411. Within the block, in one embodiment, each bit line is connected to six NAND strings.

Thus, FIG. 4J shows bit line 411 connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each region separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4J as SGS. Although the select gates SGD-s0, SGD-s1, SGD-s2, SGD-s3, SGD-s4, and SGD-s5 are isolated from each other due to the isolation regions, the data word lines WL0-WL269 are connected to data memory cells in each region (e.g., 420, 430, 44, 450, 460 and 470) of the block. FIG. 4J only shows the NAND strings connected to bit line 411. However, a full schematic of the block would show every bit line and six vertical NAND strings connected to each bit line.

Figure 4K:
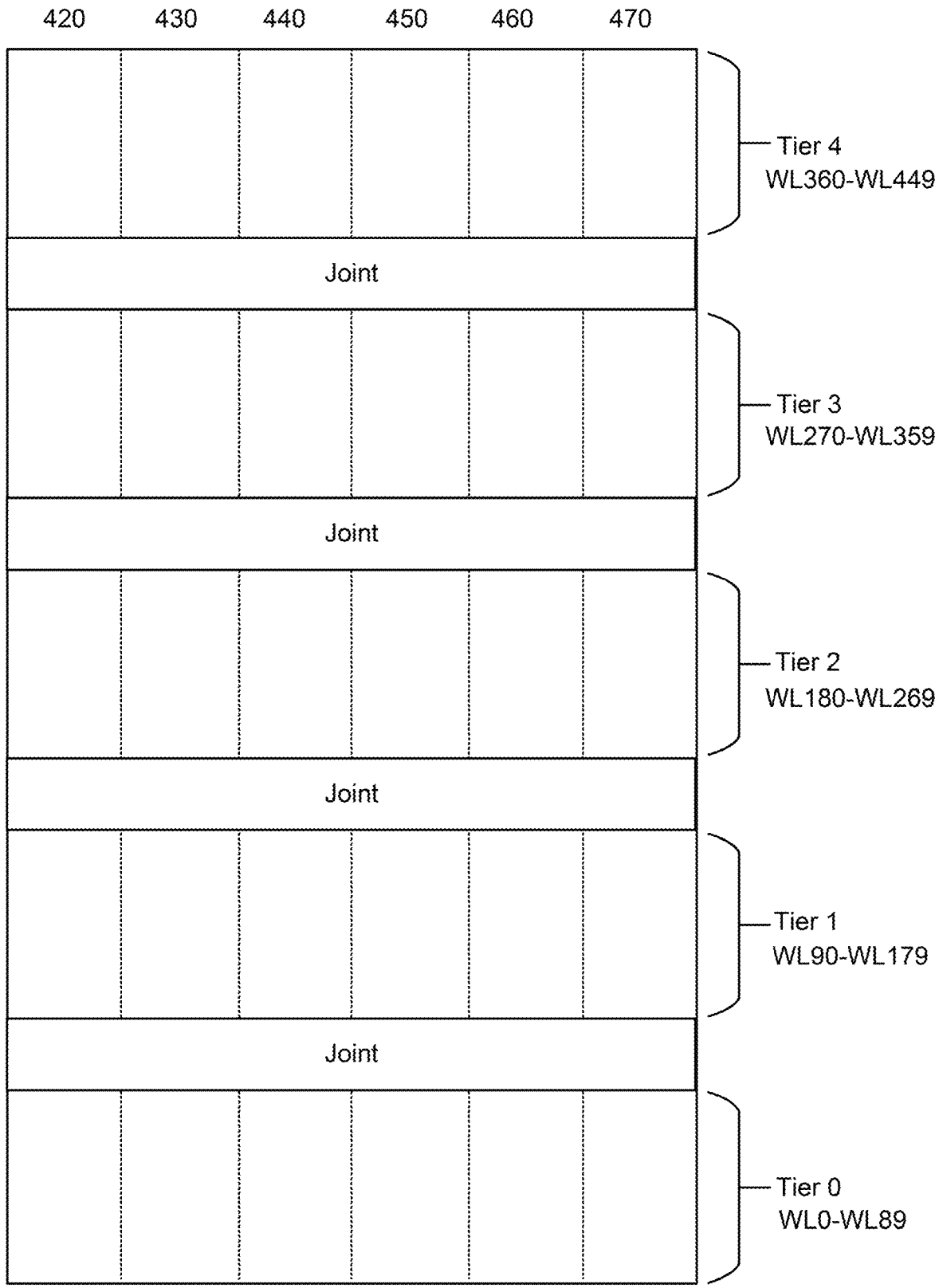
FIG. 4K depicts a cross sectional view of a portion of one embodiment of a block of memory cells.

FIG. 4K depicts a side view of Block of memory cells that has five tiers and joint regions including a joint region between each pair of neighboring tiers. That is, the tiers are separated by the Joint regions. The first tier (Tier 0) comprises word lines WL0-WL89. The second tier (Tier 1) comprises word lines WL90-WL179. The third tier (Tier 2) comprises word lines WL180-WL269. The fourth tier (Tier 3) comprises word lines W270-WL359. The fifth tier (Tier 4) comprises word lines W360-WL449. Other word line assignments can also be implemented. More or less than 450 word lines can also be implemented. In other embodiments, a memory has more than five tiers. In another embodiment, a memory has four tiers.

Figure 4L:
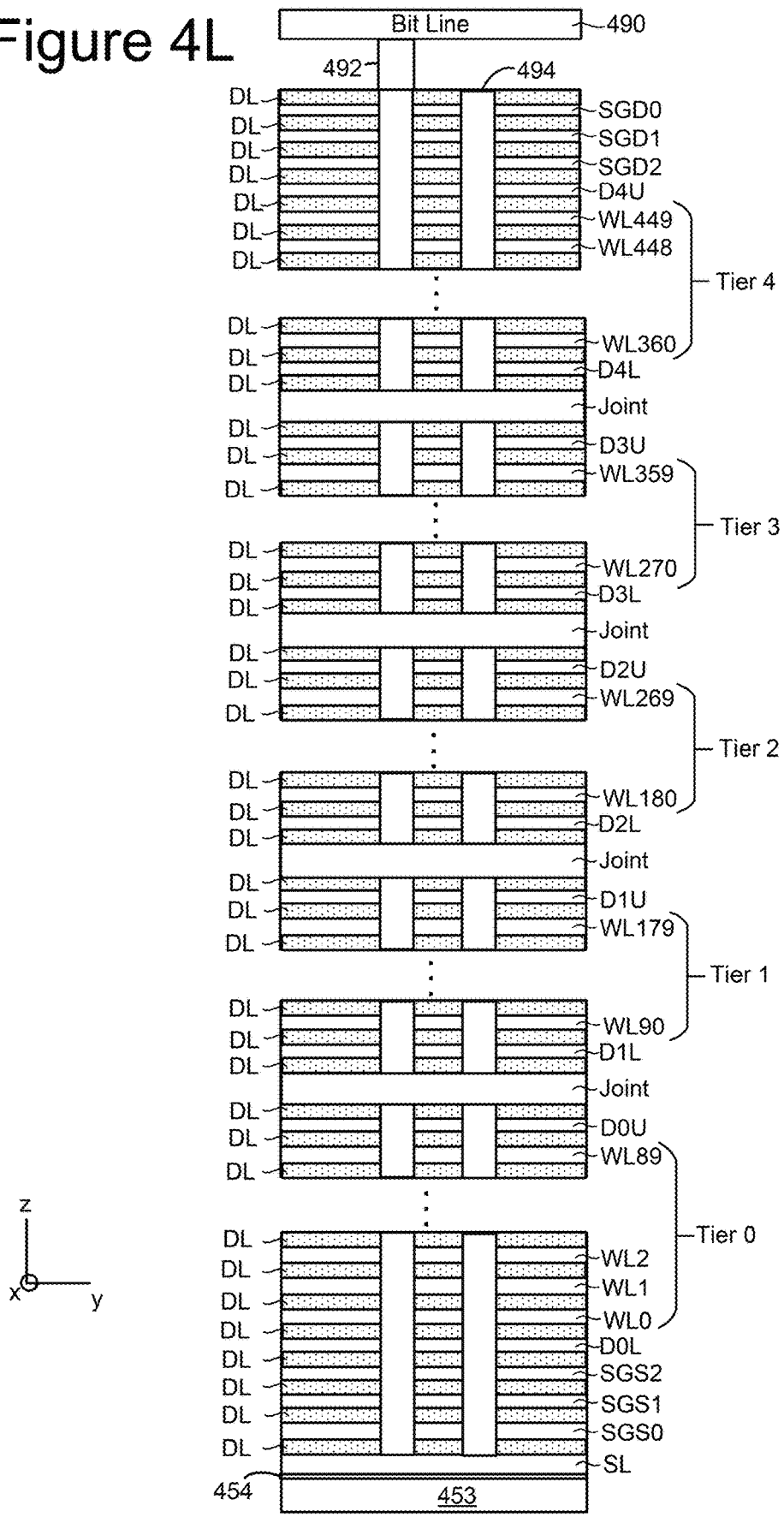
FIG. 4L depicts a cross sectional view of a portion of one embodiment of a block of memory cells.

FIG. 4L depicts a portion of one embodiment of a three dimensional memory structure showing a cross-sectional view that cuts through vertical columns (NAND strings) 492 and 494. The structure of FIG. 4L includes the same five tiers, joint Regions and 450 word lines depicted in FIG. 4K. The structure of FIG. 4L includes the same drain side select layers SGD0, SGD1 and SGD2 (that form select lines); and source side select layers SGS0, SGS1, and SGS2 (that form select lines) as FIG. 4D. FIG. 4L shows dummy word line layers on either side of the four Joint regions, including dummy word line layers D0L, DOU, D1L, D1I, D2L, D2U, D3L, D3U, D4L and D4U for connecting to dummy memory cells.

Although the example memories of FIGS. 4-4L is a three dimensional memory structure that includes vertical NAND strings with charge-trapping material, other (2D and 3D) memory structures can also be used with the technology described herein.

Figure 5A:
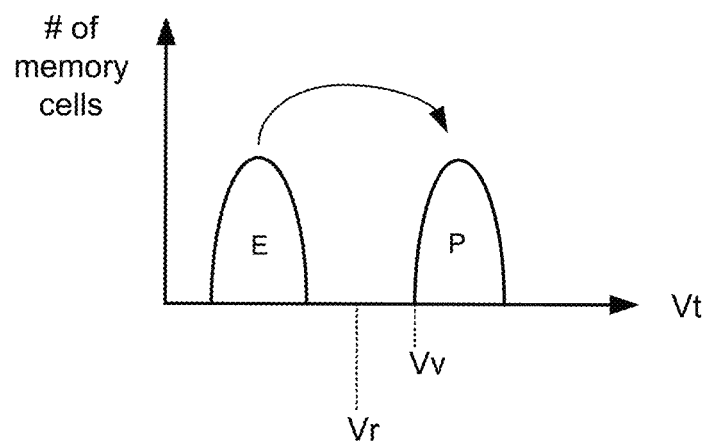
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read compare voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
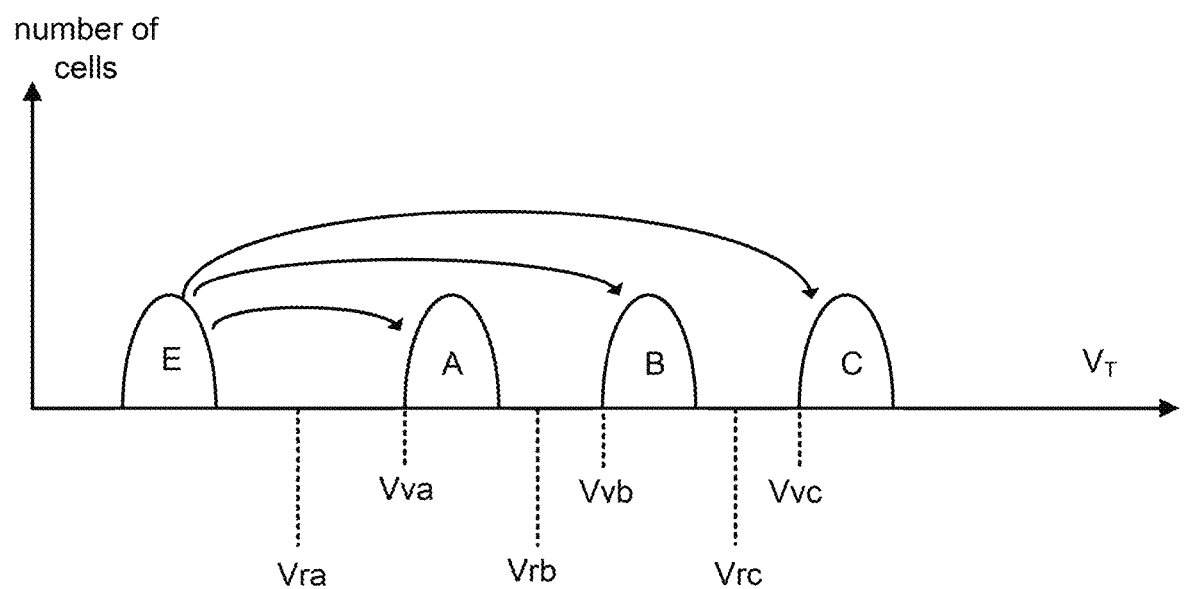
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

Figure 5C:
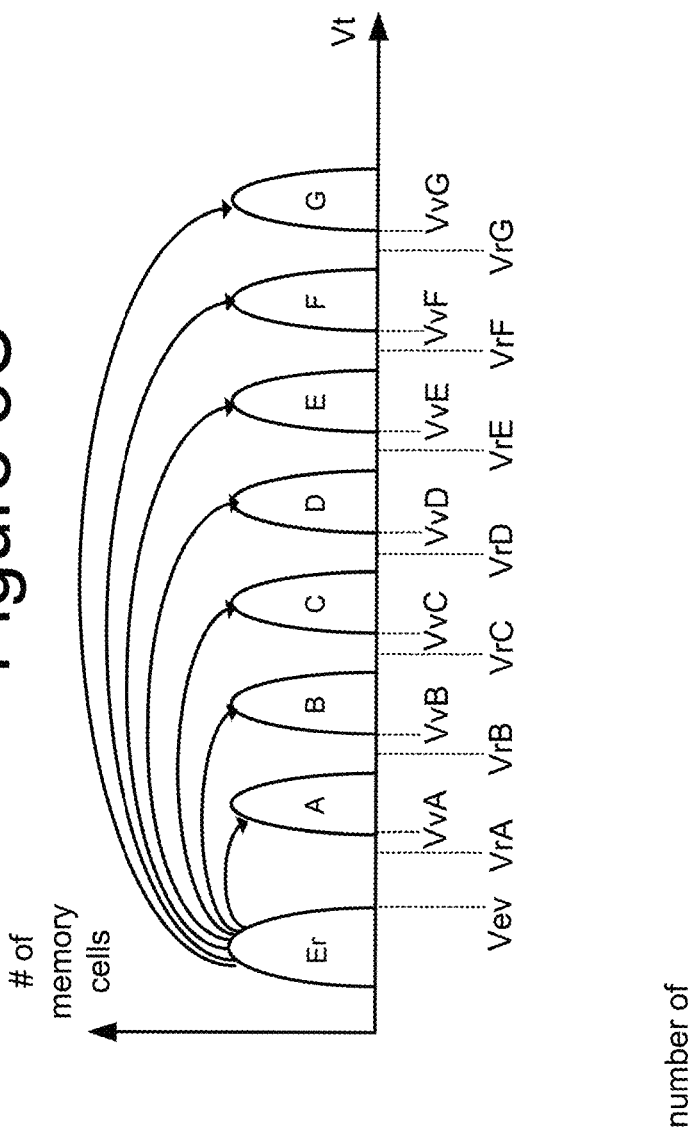
FIG. 5C depicts threshold voltage distributions.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|----|----|----|----|----|----|----|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read compare voltages, VrA, VrB, VrC, VrD, VrE, VrF, and VrG for reading data from memory cells. By testing (e.g., performing sense operations) whether the threshold voltage of a given memory cell is above or below the seven read compare voltages, the system can determine what data state (i.e., A, B, C, D, . . . ) a memory cell is in.

FIG. 5C also shows seven verify compare voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages VrA, VrB, VrC, VrD, VrE, VrF, and VrG, of FIG. 5C) or verify operation (e.g. see verify target voltages VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5D:
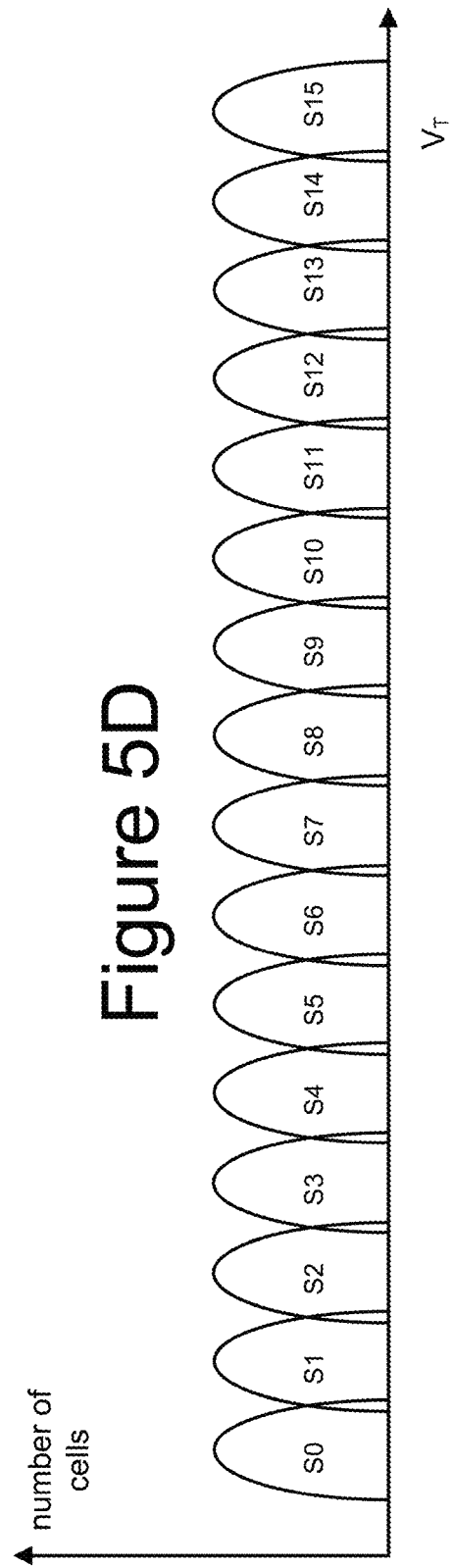
FIG. 5D depicts threshold voltage distributions.
Figure 5E:
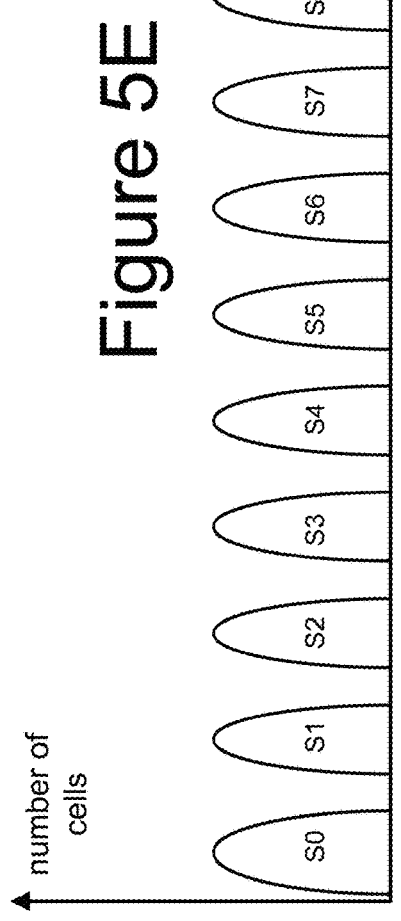
FIG. 5E depicts threshold voltage distributions.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read compare voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read compare voltages and verify compare voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 5F:
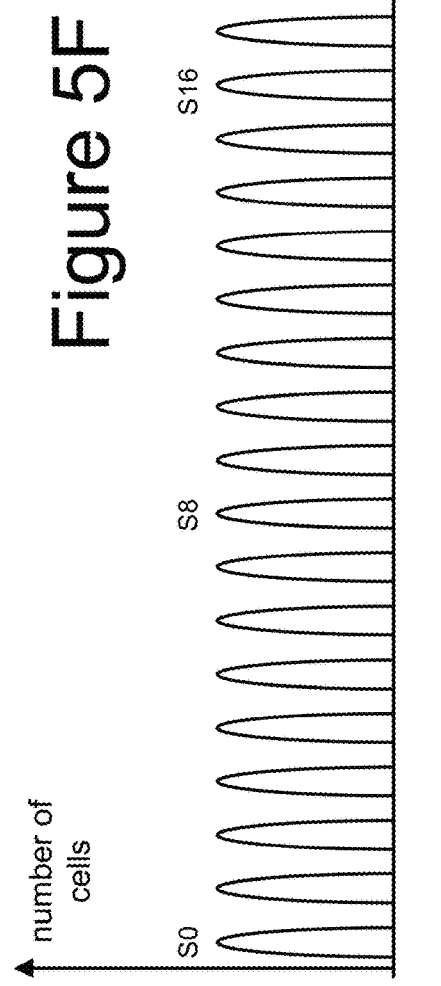
FIG. 5F depicts threshold voltage distributions.

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
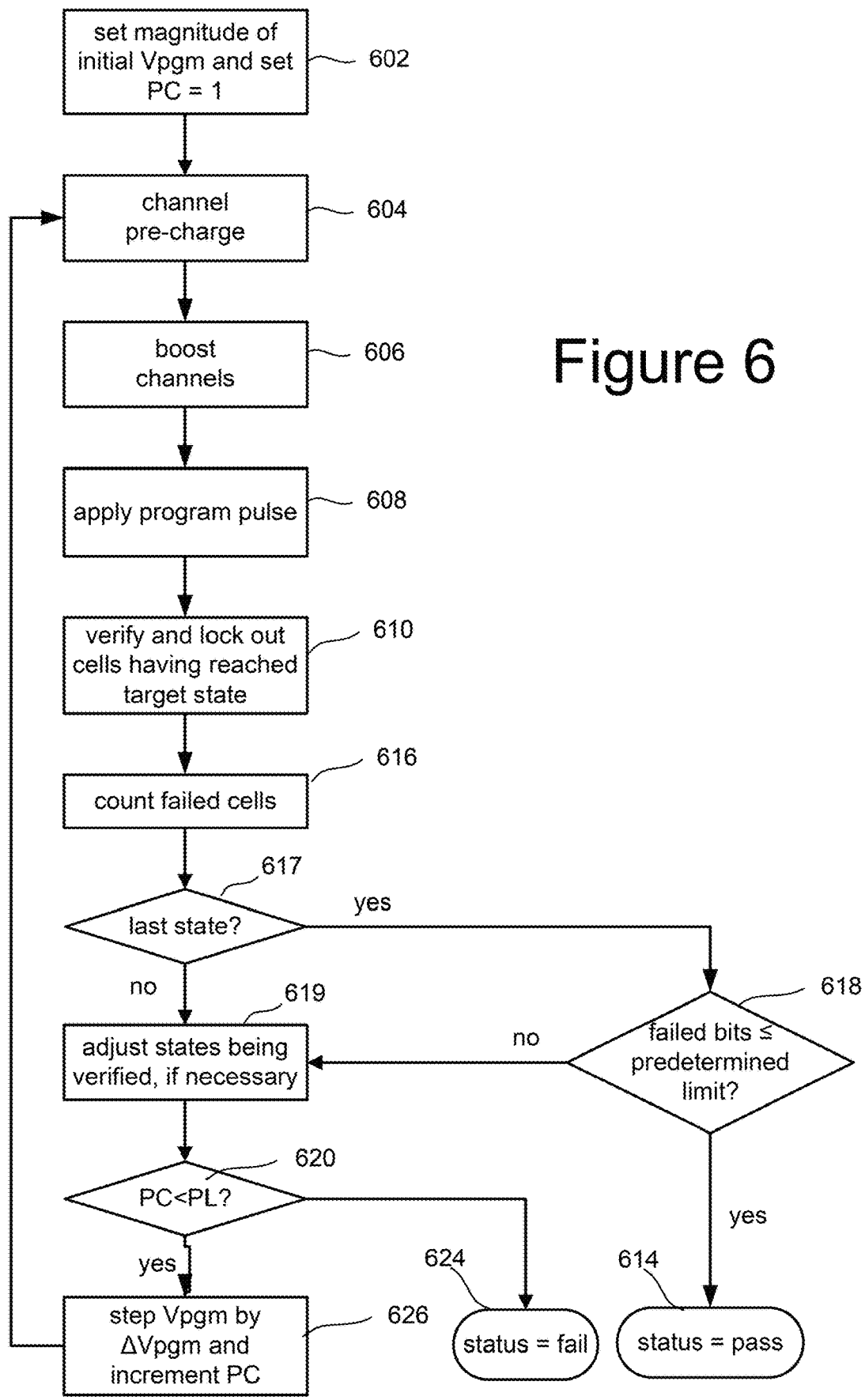
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops (referred to as program loops), each of which includes a program phase and a verify phase. The process of FIG. 6 is performed to implement the full sequence programming, as well as other programming schemes including multi-pass programming, which comprises programming processes that use multiple passes to complete programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., −12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In some embodiments, pre-charging the channels of unselected NAND strings cleans out the channel of electrons and raises the channel to a low positive voltage (e.g., approximately 1-1.3 v). In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., −7-11 volts), also referred to as pass voltages, to perform boosting schemes. A program inhibit voltage is applied to the bit lines coupled the unselected NAND string. In one embodiment, for example, the channel is pre-charged to −2 volts in step 604 and then floated. In step 606, the channel is boosted up from the 2 volts to a boosting voltage of approximately 8-10 volts.

In step 608, a program voltage pulse of the programming voltage signal Vpgm is applied to the selected word line (the word line selected for programming). In some embodiments, the magnitude and/or pulse width of the program voltage pulse can be modified from the standard magnitude and/or pulse width by one or more offsets, as described below. If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program-verify is performed and memory cells that have reached their target states are locked out from further programming by the control die. Step 610 includes performing verification of programming by sensing at one or more verify compare levels. In one embodiment, the verification process is performed by testing whether the threshold voltages of the memory cells selected for programming have reached the appropriate verify compare voltage. In one embodiment that corresponds to FIG. 5C, the process of FIG. 6 is concurrently performed for memory cells being programmed to data states A, B, C, D, E, F and G. In one embodiment, step 610 can include testing for each of data states A, B, C, D, E, F and G (e.g., testing to see whether memory cells have threshold voltages greater than VvA, VvB, VvC, VvD, VvE, VvF, and VvG). In another embodiment, the system only tests for a subset of data states A, B, C, D, E, F and G during each loop of steps 604-626 based on the current threshold voltages of the memory cells, in what is known as a smart verify process. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another loop (steps 604-626) of the programming process of FIG. 6 is performed. The loop (steps 604-626) of the programming process of FIG. 6 is referred to as a program loop.

In some embodiments, memory cells are programmed in an order from the source side to the drain side. For example, first the process of FIG. 6 is performed to program memory cells connected to WL0, followed by using the process of FIG. 6 to program memory cells connected to WL1, followed by using the process of FIG. 6 to program memory cells connected to WL2, followed by using the process of FIG. 6 to program memory cells connected to WL3, . . . followed by using the process of FIG. 6 to program memory cells connected to WL269.

In another embodiment, memory cells are programmed in an order from the drain side to the source side. For example, first the process of FIG. 6 is performed to program memory cells connected to WL269, followed by using the process of FIG. 6 to program memory cells connected to WL268, followed by using the process of FIG. 6 to program memory cells connected to WL267, followed by using the process of FIG. 6 to program memory cells connected to WL266, . . . followed by using the process of FIG. 6 to program memory cells connected to WL1, followed by using the process of FIG. 6 to program memory cells connected to WL0.

In one embodiment memory cells are erased prior to programming. Erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the memory cells. Herein, this is referred to as p-well erase.

Another approach to erasing memory cells is to generate gate induced drain leakage ("GIDL") current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a GIDL generation transistor (e.g., transistors connected to SGDT0, SGDT1, SGDT2, SGSB0, SGSB1 and SGSB2). In some embodiments, a select gate (e.g., SGD or SGS) can be used as a GIDL generation transistor. A transistor drain-to-gate voltage that generates a GIDL current is referred to herein as a GIDL voltage. The GIDL current may result when the GIDL generation transistor drain voltage is significantly higher than the GIDL generation transistor control gate voltage. GIDL current is a result of carrier generation, i.e., electron-hole pair generation due to band-to-band tunneling and/or trap-assisted generation. In one embodiment, GIDL current may result in one type of carriers (also referred to a charge carriers), e.g., holes, predominantly moving into the NAND channel, thereby raising or changing the potential of the channel. The other type of carriers, e.g., electrons, are extracted from the channel, in the direction of a bit line or in the direction of a source line, by an electric field. During erase, the holes may tunnel from the channel to a charge storage region of the memory cells (e.g., to charge trapping layer 493) and recombine with electrons there, to lower the threshold voltage of the memory cells.

The GIDL current may be generated at either end (or both ends) of the NAND string. A first GIDL voltage may be created between two terminals of a GIDL generation transistor (e.g., connected to SGDT0, SGDT1, SGDT2) that is connected to or near a bit line to generate a first GIDL current. A second GIDL voltage may be created between two terminals of a GIDL generation transistor (e.g., SGSB0, SGSB1 and SGSB2) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase. The technology described herein can be used with one-sided GIDL erase and two-sided GIDL erase.

Figure 7:
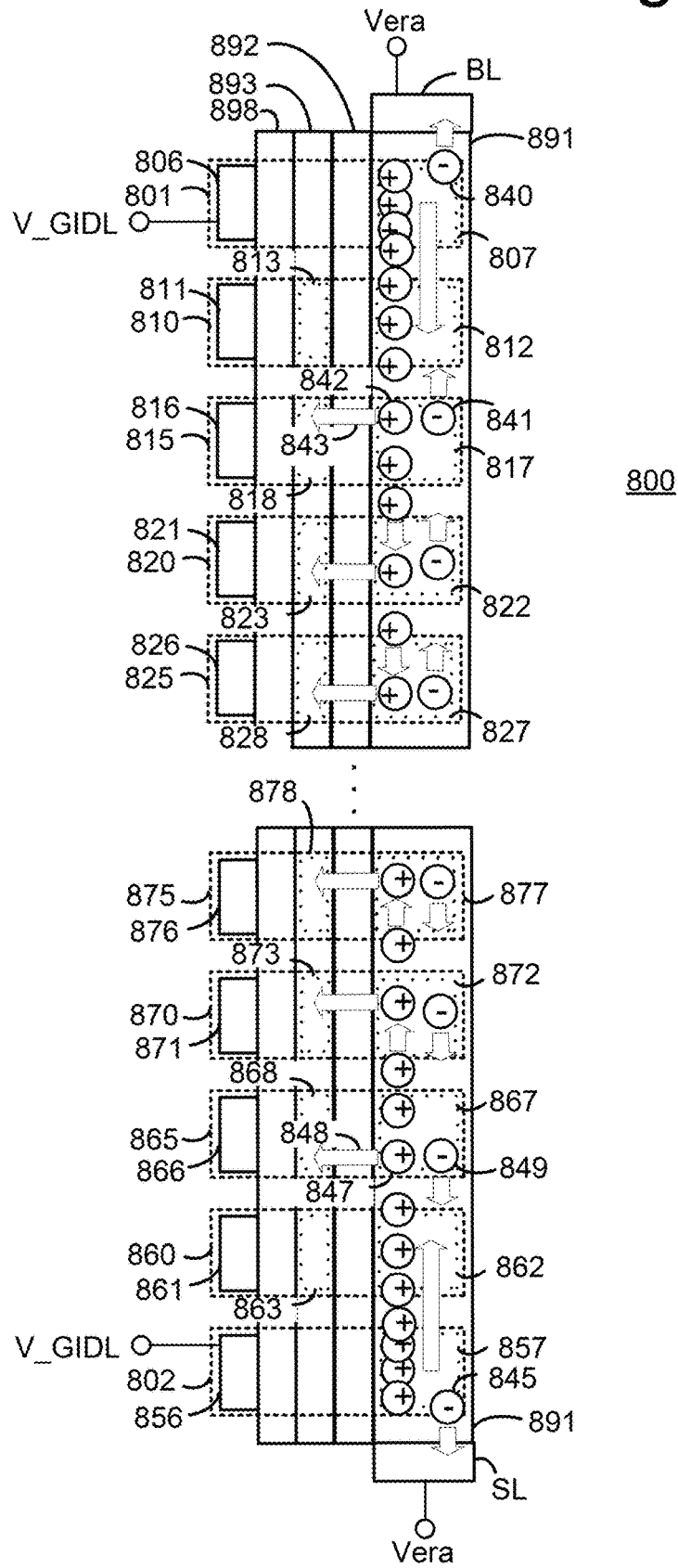
FIG. 7 depicts the erasing of a NAND string.

FIG. 7 depicts the movement of holes and electrons in a NAND string 800 during a two-sided GIDL erase. An example NAND string 800 is depicted that includes a channel 891 connected to a bit line (BL) and to a source line (SL). A tunnel dielectric layer (TNL) 892, charge trapping layer (CTL) 893, and a blocking oxide layer (BOX) 898 are layers which extend around the memory hole of the NAND string (see discussion above). Different regions of the channel layers represent channel regions which are associated with respective memory cells or select gate transistors.

Solely for purposes of simplifying the drawing and the discussion, only one drain side GIDL generation transistor 801 (e.g., representing one of SGDT0, SGDT1 or SGDT2) is depicted in FIG. 7 and only one source side GIDL generation transistor 802 (e.g., representing one of SGSB0, SGSB1 or SGSB2) is depicted in FIG. 7. Also, solely for purposes of simplifying the discussion, the select gates (i.e. SGS and SGD) of NAND string 800 are not depicted in FIG. 7. However, FIG. 7 does show NAND string 800 including memory cells 810, 815, 820, and 825; control gates 811, 816, 821, and 826; CTL regions 813, 818, 823, and 828; and channel regions 812, 817, 822, and 827, respectively. NAND string 800 also includes memory cells 860, 865, 870, and 875; control gates 861, 866, 871, and 876; CTL regions 863, 868, 873, and 878; and channel regions 862, 867, 872, and 877, respectively.

During an erase operation, an erase voltage Vera (e.g., −20V) is applied to both the bit line (BL) and to the source line (SL). A voltage V GIDL (e.g., Vera-10V or Vera-10 v) is applied to the gate 806 of the GIDL generation transistor 801 and to the gate 856 of GIDL generation transistor 802 to enable GIDL. Representative holes are depicted in the channel layers as circles with a "+" sign and representative electrons are depicted in the channel layers as circles with a "−" sign. Electron-hole pairs are generated by a GIDL process. Initially, during an erase operation, the electron-hole pairs are generated at the GIDL generation transistors. The holes move away from the driven ends into the channel, thereby charging the channel to a positive potential. The electrons generated at the GIDL generation transistor 801 move toward the bit line (BL) due to the positive potential there. The electrons generated at the GIDL generation transistor 802 move toward the source line (SL) due to the positive potential there. Subsequently, during the erase period of each memory cell, additional holes are generated by GIDL at virtual junctions which are formed in the channel at the edges of the control gate of the memory cells. Some holes are removed from the channel as they tunnel to the CTL regions.

Electrons are also generated by the GIDL process. Initially, during the erase operation, the electrons are generated at the GIDL generation transistors and move toward the driven ends. Subsequently, during the erase period of each storage element, additional electrons are generated by GIDL at virtual junctions, which are formed in the channel at the edges of the control gate of the memory cells.

At one end (e.g., drain side) of the NAND string, example electrons 840 and 841 move toward the bit line. Electron 840 is generated at the GIDL generation transistor 801 and electron 841 is generated at a junction of the memory cell 815 in the channel region 817. Also, in the drain side, example holes including a hole 842 moving away from the bit line as indicated by arrows. The hole 842 is generated at a junction of memory cell 815 in the channel region 817 and can tunnel into the CTL region 818 as indicated by arrow 843.

At the other end (e.g., source side) of the NAND string, example electrons 845 and 849 move toward the source line. Electron 845 is generated at the GIDL generation transistor 802 and electron 849 is generated at a junction of the memory cell 865 in the channel region 867. Also, at the source side, example holes including a hole 847 move away from the source line and hole 847 is generated at a junction of the memory 865 in the channel region 867 and can tunnel into the CTL region 868 as indicated by arrow 848.

Figure 8:
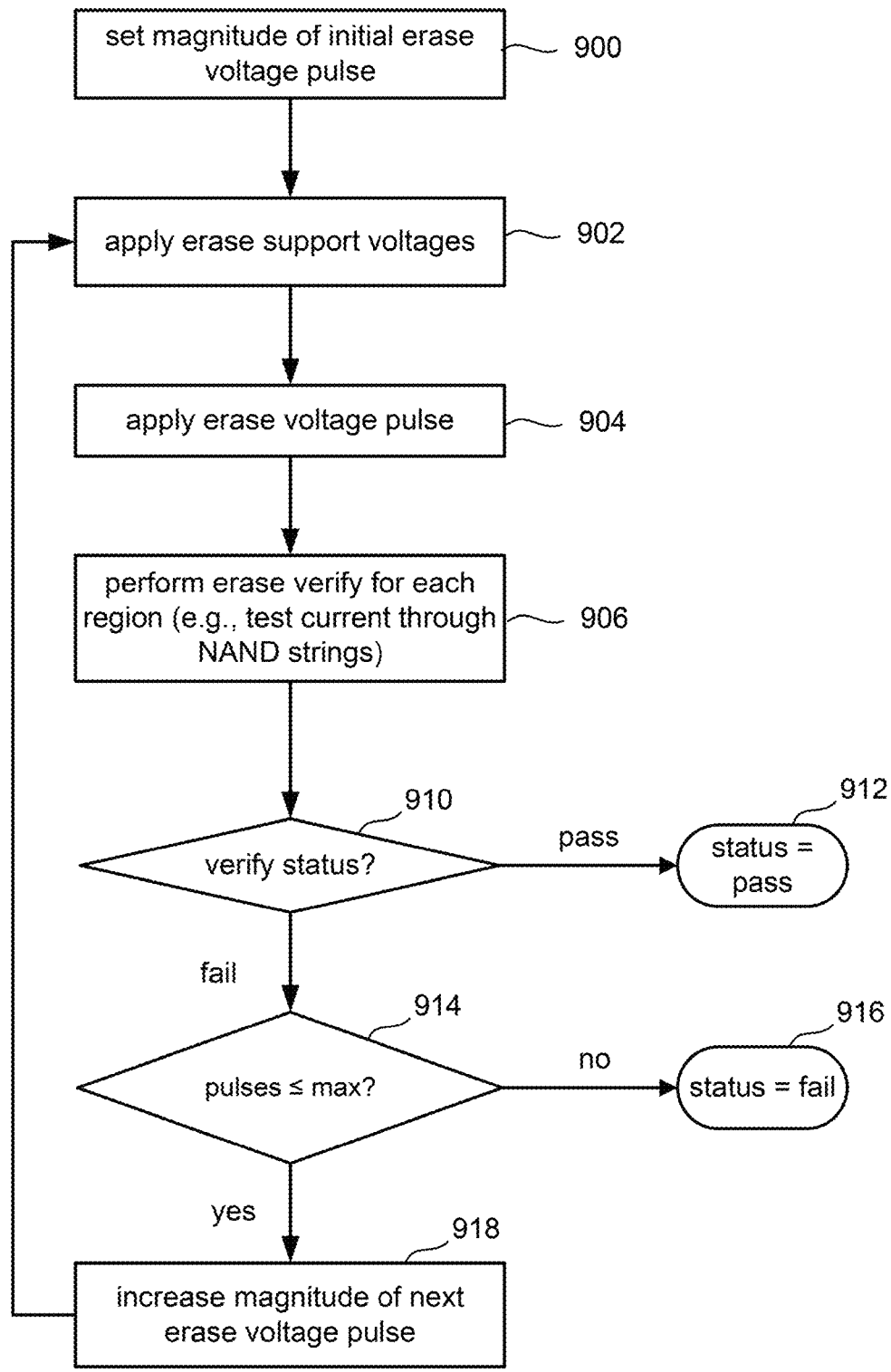
FIG. 8 is a flow chart describing one embodiment of a process for erasing.

FIG. 8 is a flow chart describing one embodiment of a traditional process for erasing non-volatile memory. In one example implementation, the process of FIG. 8 utilizes the two sided GIDL erase described by FIG. 7. In another embodiment, the process of FIG. 8 utilizes the one sided GIDL erase (GIDL at either the source side only or the drain side only). The process of FIG. 8 can be performed by any one of the one or more control circuits discussed above. For example, the process of FIG. 8 can be performed entirely by the memory die 200 (see FIG. 2A) or by the integrated memory assembly 207 (see FIG. 2B), rather than by memory controller 120. In one example, the process of FIG. 8 is performed by or at the direction of state machine 262, using other components of System Control Logic 260, Column Control Circuitry 210 And Row Control Circuitry 220. In another embodiment, the process of FIG. 8 is performed by or at the direction of memory controller 120. In one embodiment, the process of erasing is performed on a block of memory cells. That is, in one embodiment a block is the unit of erase.

In step 900 of FIG. 8, the magnitude of the initial erase voltage pulse (Vera) is set. One example of an initial magnitude is 20 volts (Vera=20 v). However, other initial magnitudes can also be used. In step 902, various erase support voltages are applied. For example, step 902 may include applying the appropriate voltages to the data word lines, dummy word lines, drain side select lines (SGD) and source side select lines (SGS). In step 904, an erase voltage pulse is applied to the NAND strings of the block. In one embodiment of two sided GIDL erase, the erase voltage pulse is applied to the bit lines and the source line. In one embodiment of one sided GIDL erase, the erase voltage pulse is applied to the source line. In another embodiment of one sided GIDL erase, the erase voltage pulse is applied to the bit lines.

In step 906, erase verify is performed separately for each region of the block being erased. For example, in an embodiment with six regions 420, 430, 440, 450, 460 and 470 of FIG. 4B), first step 906 is performed for region 420, subsequently step 906 is performed for region 430, subsequently step 906 is performed for region 440, subsequently step 906 is performed for region 450, subsequently step 906 is performed for region 460, and finally step 906 is performed for region 470. In one embodiment, when performing erase verify for a region, erase verify for memory cells connected to even word lines is performed separately from performing erase verify for memory cells connected to odd word lines. That is, the control circuit will perform erase verify for those memory cells connected to even word lines while not performing erase verify for memory cells connected to odd word lines. Subsequently, the control circuit will perform erase verify for those memory cells connected to odd word lines while not performing erase verify for memory cells connected to even word lines. When performing erase verify for memory cells connected to even word lines, the even word lines will receive VCG_Vfy and odd word lines will receive Vread. The control circuit will sense the NAND strings (e.g., using the sense amplifiers) to determine if sufficient current is flowing in order to verify whether all of the memory cells of the NAND string have a threshold voltage lower than an erase verify voltage (e.g., Vev of FIG. 5C). When performing erase verify for memory cells connected to odd word lines, the odd word lines will receive VCG_Vfy and even word lines will receive Vread. The control circuit will sense the NAND strings to determine if sufficient current is flowing in order to verify whether all of the memory cells of the NAND string have a threshold voltage lower than an erase verify voltage.

In step 910, the control circuit determines the status of the erase verify (from step 906). If all of the NAND strings passed erase verify for odd word lines and erase verify for even word lines, then the process will continue at step 912 and return a status of "Pass" as the erase process is not completed. In some embodiments, if the number of NAND strings that have failed erase verify is less than a first threshold then the control circuit will consider the verification process to have passed and the process will also continue at step 912. If the number of NAND strings that have failed erase verify is greater than the first threshold, then the process will continue with step 914. In one embodiment, the first threshold is a number that is smaller than the number of bits that can be corrected by ECC during a read process.

In step 914, the control circuit determines whether the number of erase voltage pulses is less than or equal to a maximum number of pulses. In one example, the maximum number is six pulses. In another example, the maximum number is 20 pulses. Other examples of maximum numbers can also be used. If the number of pulses is less than or equal to the maximum number, then the control circuit will perform another loop of the erase process (e.g., steps 902-918), which includes applying another erase voltage pulse. Thus, the process will continue at step 918 to increase the magnitude of the next erase voltage pulse (e.g., by a step size between 0.1-0.25 volts) and then the process will loop back to step 902 (e.g., Vera=Vera+step). If, in step 914, it is determined that the number of erase voltage pulses already applied in the current erase process is greater than the maximum number, then the erase process failed (step 916) and the current block being erased is retired from any further use by the memory system.

It has been determined that in systems with more than two tiers, inner tiers erase at slower speeds than outer tiers, which can lead to issues with device reliability. For example, Tier 1 of FIGS. 4C and 4D erases at slower speeds than Tier 0 and Tier 2. Similarly, Tier 2 of FIGS. 4K and 4L erases at slower speeds than Tier 1 and Tier 3, while Tier 1 and Tier 3 erase at slower speeds than Tier 0 and Tier 4. This phenomenon is depicted in FIGS. 9A and 9B.

FIG. 9A depicts three tiers (Tier 0, Tier 1 and Tier 2) of a memory hole (vertical column), with Joint regions between the Tiers. Tier 0 and Tier 2 erase fast while Tier 1 erases slower. Arrow 950 depicts holes from GIDL generation at the SGS transistor moving across the channel and arrow 960 depicts holes from GIDL generation at the SGD transistor moving across the channel. Arrow 952 shows holes transferring from Tier 0 to Tier 1 by moving through the Joint region resulting in less holes in the channel of Tier 1 (see arrow 954). Arrow 958 shows holes transferring from Tier 2 to Tier 1 by moving through the Joint region resulting in less holes in the channel of Tier 1 (see arrow 956). Thus, the Joint region reduces GIDL efficiency for the inner tier (Tier 1). As there are less holes in Tier 1, erasing of memory cells in Tier 1 occurs slower than Tier 0 or Tier 2 (the outer tiers).

FIG. 9B depicts five tiers (Tier 0, Tier 1, Tier 2, Tier 3, and Tier 4) of a memory hole (vertical column), with Joint regions between neighboring (adjacent) tiers. Tier 0 and Tier 4 erase fast. Tier 1 and Tier 3 erase slower than Tiers 0/4. Tier 2 erases the slowest of the five tiers depicted. In this example, Tier 0 and Tier 4 are the outer tiers, while Tier 1, Tier 2 and Tier 3 are inner tiers. Tier 2 is the middle tier. Arrow 962 depicts holes from GIDL generation at the SGS transistor moving across the channel and arrow 978 depicts holes from GIDL generation at the SGD transistor moving across the channel. Arrow 964 shows holes transferring from Tier 0 to Tier 1 by moving through the Joint region resulting in less holes in the channel of Tier 1 (see arrow 966). Arrow 968 shows holes transferring from Tier 1 to Tier 2 by moving through the Joint region resulting in less holes in the channel of Tier 2 (see arrow 969). Arrow 976 shows holes transferring from Tier 4 to Tier 3 by moving through the Joint region resulting in less holes in the channel of Tier 3 (see arrow 974). Arrow 972 shows holes transferring from Tier 3 to Tier 2 by moving through the Joint region resulting in less holes in the channel of Tier 2 (see arrow 970). Thus, the Joint regions reduce GIDL efficiency for the inner tiers (Tier 1, Tier 2 and Tier 3). As there are less holes in Tier 1 and Tier 3, erasing of memory cells in Tier 1 and Tier 3 (inner tiers) occurs slower than Tier 0 or Tier 4 (the outer tiers). As there are less holes in Tier 2, erasing of memory cells in Tier 2 occurs slower than Tier 1 or Tier 3.

The differences in erase speed can lead to issues with device reliability. For example, over erasing or under erasing can lead to programming errors subsequent to the erasing. Additionally, tiers that erase too slow may cause a block to be mismarked as a bad block. Therefore, in order to achieve uniform erase speed for three or more tiers, the erase process comprises concurrently erasing the three or more tiers using a GIDL erase process that transfers holes from outer tiers to inner tiers through the joint regions including compensating for intrinsic erase speed differences between the tiers to achieve uniform erase speed for the three or more tiers by applying a larger voltage bias to control gates of non-volatile memory cells in the outer tiers than the voltage bias applied to control gates of non-volatile memory cells in one or more inner tiers.

Figure 10:
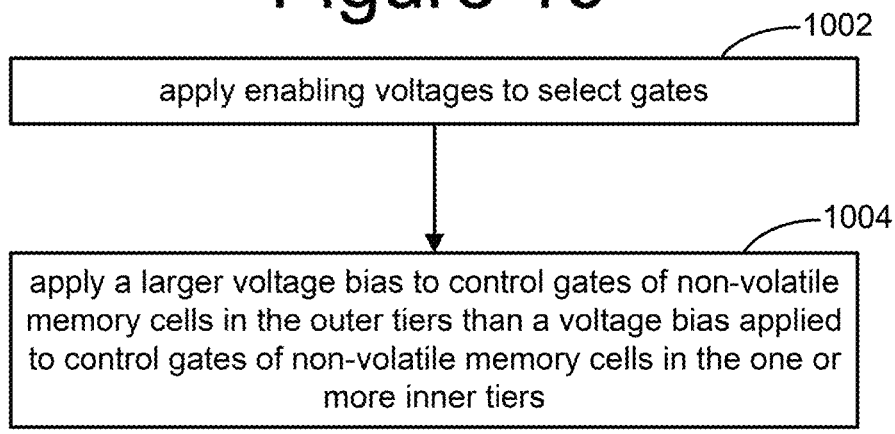
FIG. 10 is a flow chart describing one embodiment of a process for concurrently erasing three or more tiers including compensating for intrinsic erase speed differences between the tiers to achieve uniform erase speed for the three or more tiers.

FIG. 10 is a flow chart describing one embodiment of a process for concurrently erasing three or more tiers including compensating for intrinsic erase speed differences between the tiers to achieve uniform erase speed for the three or more tiers. The process of FIG. 10 can be performed by any one of the control circuits discussed above. For example, the process of FIG. 10 can be performed entirely by the memory die 200 (see FIG. 2A) or by the integrated memory assembly 207 (see FIG. 2B), rather than by memory controller 120. In one example, the process of FIG. 10 is performed by or at the direction of state machine 262, using other components of System Control Logic 260, Column Control Circuitry 210 And Row Control Circuitry 220. In another embodiment, the process of FIG. 10 is performed by or at the direction of memory controller 120.

In one embodiment, the process of FIG. 10 is an example implementation of step 902 of FIG. 8 such that the steps of FIG. 10 are part of the erasing of non-volatile memory cells. In step 1002 of FIG. 10, the control circuit applies enabling voltages to select gates. For example, the control circuit can apply Vera-10 v to SGS and SGD. In step 1004, the control circuit applies a larger voltage bias to control gates of non-volatile memory cells in the outer tiers than a voltage bias applied to control gates of non-volatile memory cells in the one or more inner tiers. For example, the control circuit can apply larger voltages to control gates of Tier 0 and Tier 2 as compared to the smaller voltages applied to control gates of Tier 1 for a three tier architecture. Similarly, the control circuit can apply larger voltages to control gates of Tier 0 and Tier 4 as compared to the smaller voltages applied to control gates of Tier 1, Tier 3 and Tier 3 for a five tier architecture. This technology can also be applied to a four tier architecture or an architecture for more than five tiers. In one embodiment, the control circuit is configured to apply the larger voltage bias to control gates of non-volatile memory cells in the outer tiers to create a weaker gradient between word lines and the channels for outer tiers and apply the smaller voltage bias to control gates of non-volatile memory cells in the inner tiers to create a stronger gradient between word lines and the channels for outer tiers (to compensate for less holes in the channel) in order to have the inner tiers erase at the same speed as the outer tiers.

Figure 11:
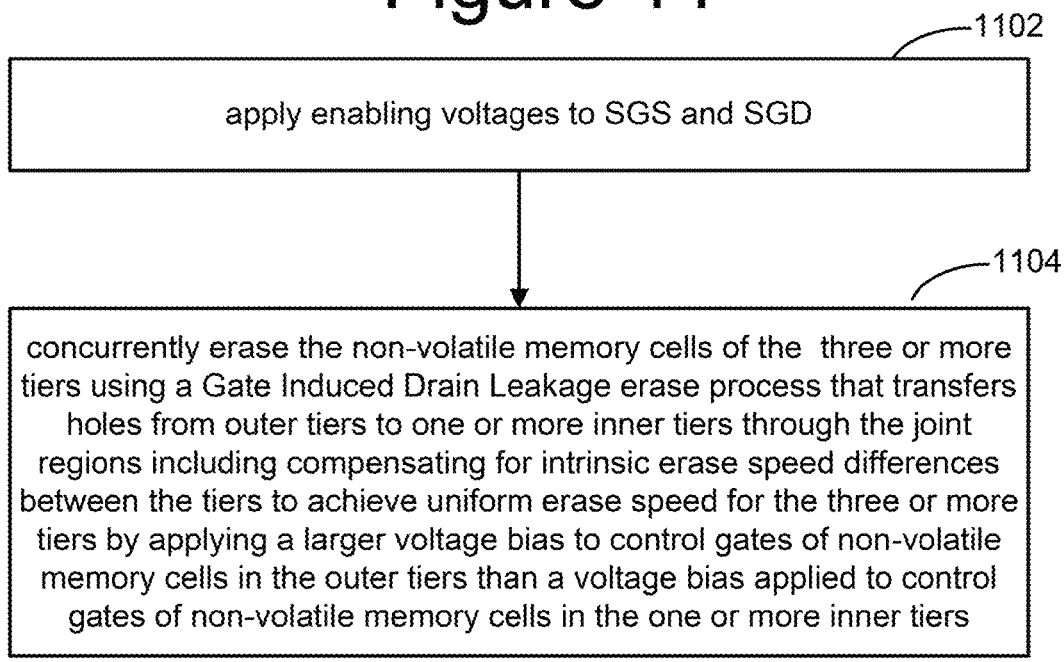
FIG. 11 is a flow chart describing one embodiment of a process for concurrently erasing three or more tiers including compensating for intrinsic erase speed differences between the tiers to achieve uniform erase speed for the three or more tiers.

FIG. 11 is a flow chart describing one embodiment of a process for concurrently erasing three or more tiers including compensating for intrinsic erase speed differences between the tiers to achieve uniform erase speed for the three or more tiers. The process of FIG. 11 is an example implementation of the process of FIG. 10. The process of FIG. 11 can be performed by any one of the control circuits discussed above. For example, the process of FIG. 11 can be performed entirely by the memory die 200 (see FIG. 2A) or by the integrated memory assembly 207 (see FIG. 2B), rather than by memory controller 120. In one example, the process of FIG. 11 is performed by or at the direction of state machine 262, using other components of System Control Logic 260, Column Control Circuitry 210 And Row Control Circuitry 220. In another embodiment, the process of FIG. 10 is performed by or at the direction of memory controller 120.

In one embodiment, the process of FIG. 11 is an example implementation of step 902 of FIG. 8 such that the steps of FIG. 11 are part of the erasing of non-volatile memory cells. In step 1102 of FIG. 11, the control circuit applies enabling voltages to SGS and SGD. In step 1004, the control circuit concurrently erases the non-volatile memory cells of the three or more tiers using a GIDL erase process that transfers holes from outer tiers to one or more inner tiers through the joint regions including compensating for intrinsic erase speed differences between the tiers to achieve uniform erase speed for the three or more tiers by applying a larger voltage bias to control gates of non-volatile memory cells in the outer tiers than a voltage bias applied to control gates of non-volatile memory cells in the one or more inner tiers.

FIG. 12 is a flow chart describing one embodiment of a process for concurrently erasing three or more tiers including compensating for intrinsic erase speed differences between the tiers to achieve uniform erase speed for the three or more tiers. The process of FIG. 12 is an example implementation of the process of FIG. 10. The process of FIG. 12 can be performed by any one of the control circuits discussed above. For example, the process of FIG. 12 can be performed entirely by the memory die 200 (see FIG. 2A) or by the integrated memory assembly 207 (see FIG. 2B), rather than by memory controller 120. In one example, the process of FIG. 12 is performed by or at the direction of state machine 262, using other components of System Control Logic 260, Column Control Circuitry 210 And Row Control Circuitry 220. In another embodiment, the process of FIG. 10 is performed by or at the direction of memory controller 120.

In one embodiment, the process of FIG. 12 is an example implementation of steps 902 and 904 of FIG. 8 such that the steps of FIG. 12 are part of the erasing of non-volatile memory cells. In step 1202 of FIG. 12, the control circuit applies an erase voltage to both ends of groups of connected non-volatile memory cells that are divided into three or more tiers with a joint region between each pair of neighboring tiers. For example, Vera is applied to the source line and the bit lines of NAND strings. In step 1204, the control circuit applies enabling voltages to select gates at both ends of the groups of connected non-volatile memory cells. For example, the control circuit can apply Vera-10 v to SGS and SGD. In step 1206, the control circuit applies a first voltage to control gates of non-volatile memory cells in a first set of tiers physically closer to the select gates. For example, with respect to a three tier architecture, Tier 0 and Tier 2 are closer to the select gates (as compared to Tier 1) as Tier 0 and Tier 2 are adjacent the select gates. With respect to a five tier architecture, Tier 0 and Tier 4 are closer to the select gates as they are adjacent the select gates. In step 1206, the control circuit applies a second voltage to control gates of non-volatile memory cells in a second set of one or more tiers physically farther from the select gates than the first set of tiers. The first voltage is larger than the second voltage. For example, with respect to a three tier architecture, Tier 1 is further from the select gates and with respect to a five tier architecture, Tiers 1/2/3 are further from the select gates. By applying a lower voltage to the tiers further from the select gates, a stronger gradient is created between word lines and the channels for the tiers further from the select gates as compared to the tiers closer from the select gates. A stronger gradient between word lines and the channels results in a speeding up of the erase process for intrinsically slow to erase tiers.

Figure 13A:
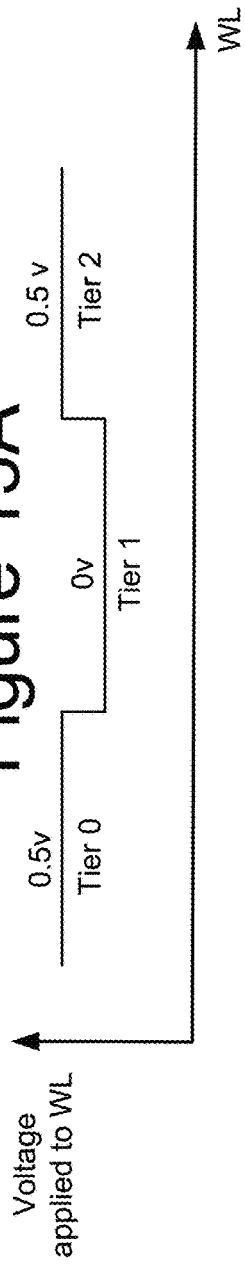
FIG. 13A depicts a graph of word line voltage versus word line position.
Figure 13B:
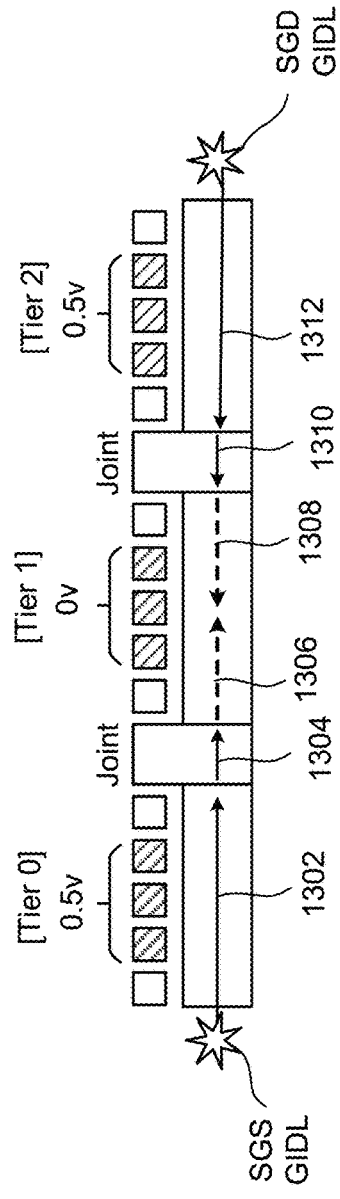
FIG. 13B depicts three tiers of a memory hole.
Figure 13C:
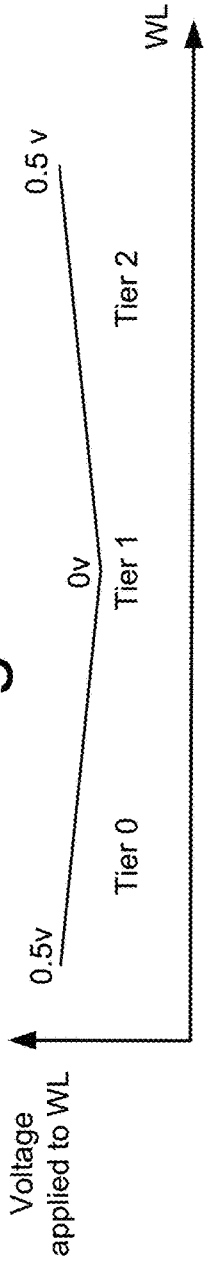
FIG. 13C depicts a graph of word line voltage versus word line position.

FIGS. 13A-C provide example implementations of the processes of FIGS. 10, 11 and/or 12 for a three tier architecture. FIG. 13A depicts a graph of word line voltage versus word line position. FIG. 13B depicts three tiers for a NAND string. FIGS. 13A and 13B depict applying 0.5 volts to the control gates of memory cells in Tier 0 (e.g., by applying 0.5 v to WL0-WL89), applying 0 volts to the control gates of memory cells in Tier 1 (e.g., by applying 0 v to WL90-WL179), and applying 0.5 volts to the control gates of memory cells in Tier 2 (e.g., by applying 0.5 v to WL180-WL269) as part of step 1004, step 1104 and/or steps 1206/1208. In regard to steps 1206/1208 of FIG. 12, the first voltage is 0.5 v and the second voltage is 0 v. As a result of applying the different voltages depicted in FIG. 13A and FIG. 13B, the three tiers erase at the same speed. Note that FIG. 13B only shows three control gates for data memory cells (shaded squares) and two control gates for dummy memory cells (unshaded squares) in order to simplify the drawing, but in an actual implementation each tier has many more data memory cells.

FIG. 13B graphically depicts using a GIDL erase process that transfers holes from outer tiers to one or more inner tiers through the joint regions including compensating for intrinsic erase speed differences between the tiers to achieve uniform erase speed. For example, in FIG. 13B arrow 950 depicts holes from GIDL generation at the SGS transistor moving across the channel and arrow 1212 depicts holes from GIDL generation at the SGD transistor moving across the channel. Arrow 1304 shows holes transferring from Tier 0 to Tier 1 by moving through the Joint region resulting in less holes in the channel of Tier 1 (see arrow 1306. Arrow 1310 shows holes transferring from Tier 2 to Tier 1 by moving through the Joint region resulting in less holes in the channel of Tier 1 (see arrow 1308). However, due to the lower control gate voltage applied to Tier 1 the erase speed of Tier 1 is the same as the erase speed of Tier 0 and Tier 2.

FIG. 13C depicts a graph of word line voltage versus word line position for an alternative embodiment. Rather than have all data memory cells of a tier receive the same control gate voltage, the control gate voltage is varied to create a continuous gradient. For example, the voltages applied to the control gate can be implemented using the following function:

$$\text{control gate voltage} = f(\min(\text{distance to } SG, \text{distance to } SGD)) \quad \text{[Equation A]}$$

FIGS. 14A-C are similar to FIGS. 13A-C; however, the voltages applied to the control gates are lower and, in some cases negative. Using lower voltages at the control gate allows for using a lower Vera (the erase voltage applied to the bit line and source line). Using a lower Vera allows for a less complicated, smaller and less expensive charge pump. FIGS. 14A and 14B depict applying 0 volts to the control gates of memory cells in Tier 0 (e.g., by applying 0 v to WL0-WL89), applying −0.5 volts to the control gates of memory cells in Tier 1 (e.g., by applying −0.5 v to WL90-WL179), and applying 0 volts to the control gates of memory cells in Tier 2 (e.g., by applying 0 v to WL180-WL269) as part of step 1004, step 1104 and/or steps 1206/1208. As a result of applying the different voltages depicted in FIG. 14A and FIG. 14B, the three tiers erase at the same speed. FIG. 14C depicts an alternative that includes applying the control gate voltage as a function (e.g., Equation A) of word line position to create a continuous gradient.

Figure 15A:
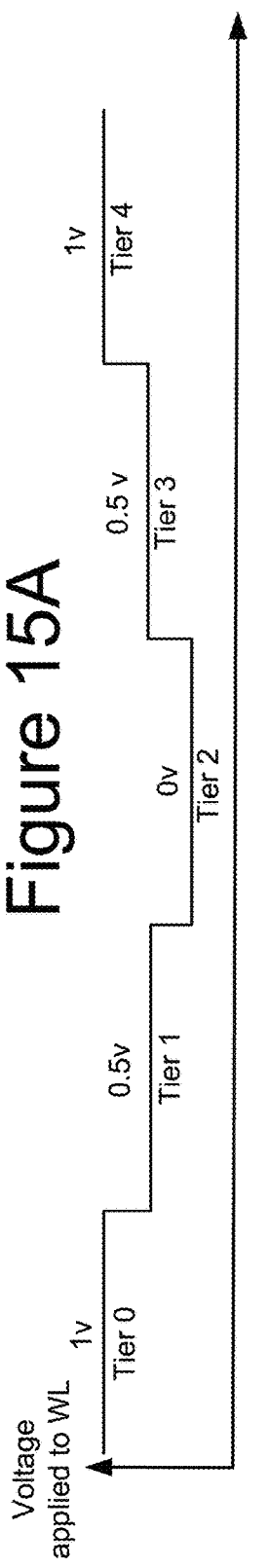
FIG. 15A depicts a graph of word line voltage versus word line position.
Figure 15B:
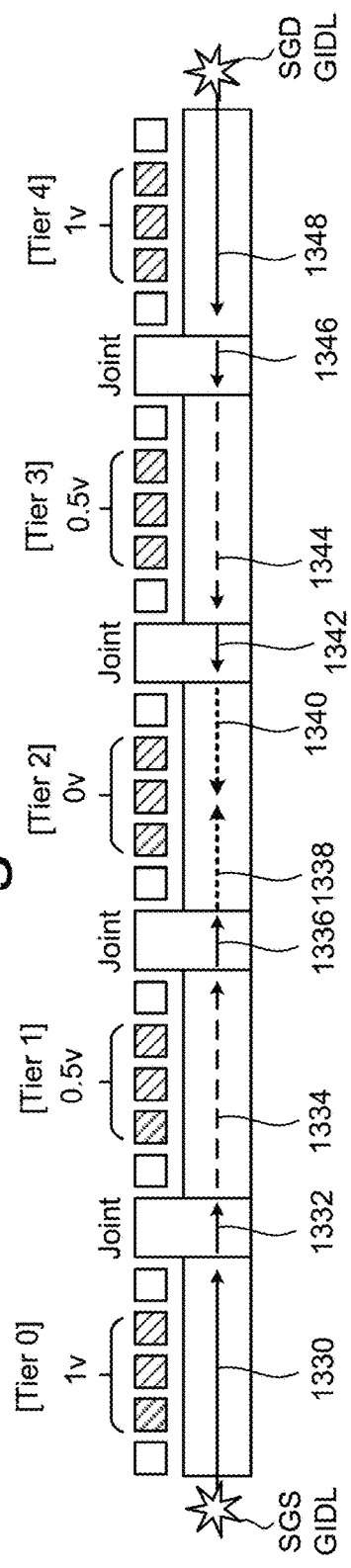
FIG. 15B depicts five tiers of a memory hole.
Figure 15C:
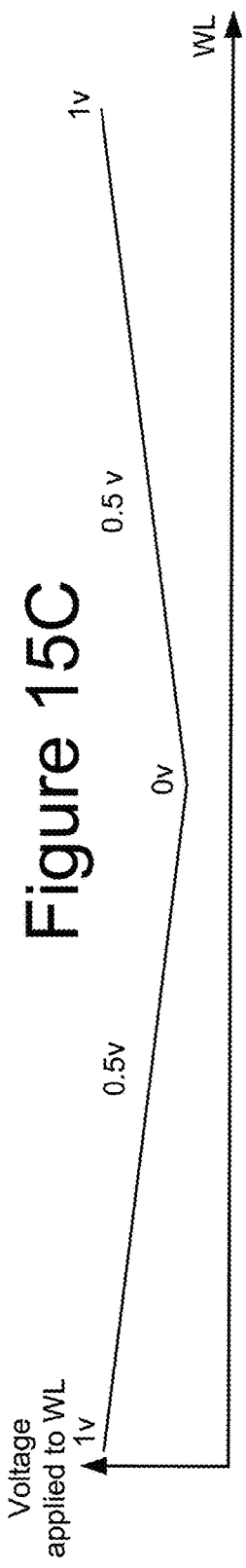
FIG. 15C depicts a graph of word line voltage versus word line position.

FIGS. 15A-C provide an example implementation of the processes of FIGS. 10, 11 and/or 12 for a five tier architecture. FIG. 15A depicts a graph of word line voltage versus word line position. FIG. 15B depicts five tiers for a NAND string. FIGS. 15A and 15B depict applying 1 volt to the control gates of memory cells in Tier 0 (e.g., by applying 1 v to WL0-WL89), applying 0.5 volts to the control gates of memory cells in Tier 1 (e.g., by applying 0.5 v to WL90-WL179), applying 0 volts to the control gates of memory cells in Tier 2 (e.g., by applying 0 v to WL180-WL269), applying 0.5 volts to the control gates of memory cells in Tier 3 (e.g., by applying 0.5 v to WL270-WL359), and applying 1 volt to the control gates of memory cells in Tier 4 (e.g., by applying 1 v to WL360-WL449) as part of step 1004, step 1104 and/or steps 1206/1208. In regard to steps 1206/1208 of FIG. 12, the first voltage is 1 v and the second voltage is 0.5 v or 0 v. As a result of applying the different voltages depicted in FIG. 15A and FIG. 15B, the three tiers erase at the same speed. FIG. 15C depicts an alternative that includes applying the control gate voltage as a function (e.g., Equation A) of word line position to create a continuous gradient.

Figure 16A:
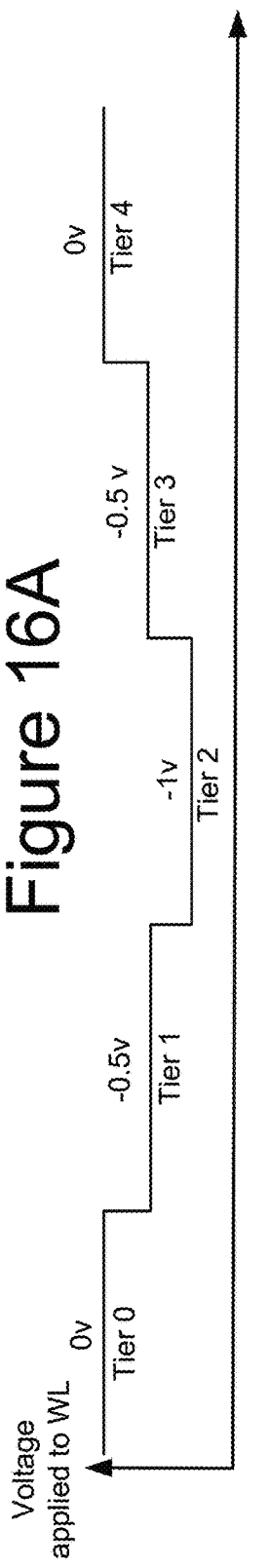
FIG. 16A depicts a graph of word line voltage versus word line position.
Figure 16B:
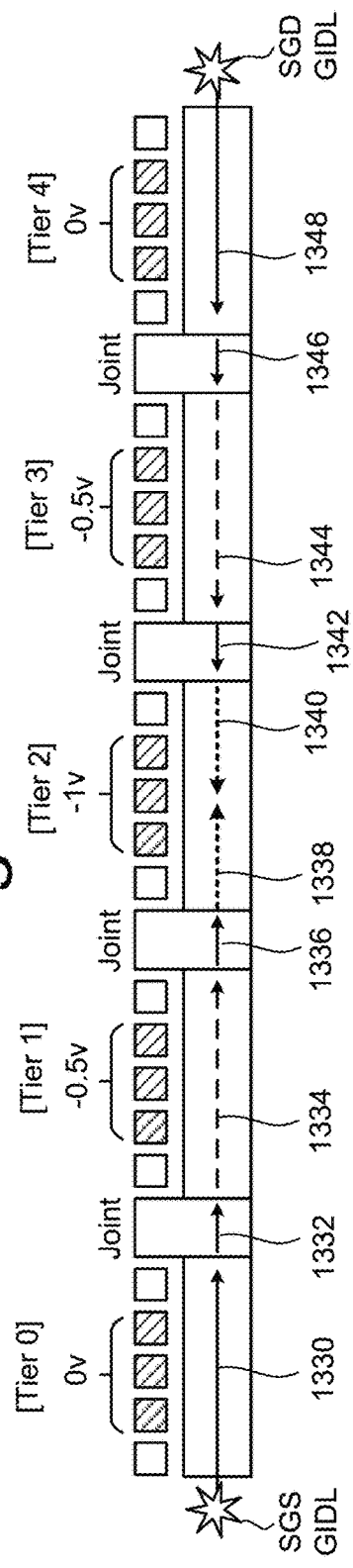
FIG. 16B depicts five tiers of a memory hole.
Figure 16C:
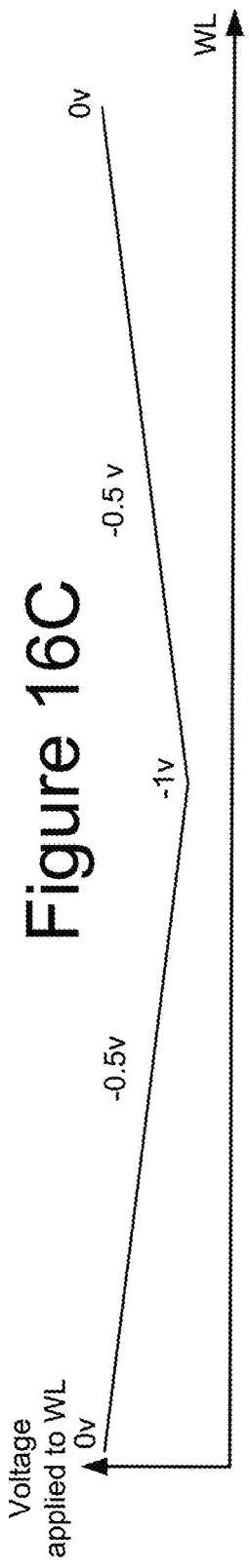
FIG. 16C depicts a graph of word line voltage versus word line position.

FIGS. 16A-C provide are similar to FIGS. 15A-C; however, the voltages applied to the control gates are lower and, in some cases negative. FIGS. 16A and 16B depict applying 0 volts to the control gates of memory cells in Tier 0 (e.g., by applying 0 v to WL0-WL89), applying −0.5 volts to the control gates of memory cells in Tier 1 (e.g., by applying −0.5 v to WL90-WL179), applying −1 volts to the control gates of memory cells in Tier 2 (e.g., by applying −1 v to WL180-WL269), applying −0.5 volts to the control gates of memory cells in Tier 3 (e.g., by applying −0.5 v to WL270-WL359), and applying 0 volts to the control gates of memory cells in Tier 4 (e.g., by applying 1 v to WL360-WL449) as part of step 1004, step 1104 and/or steps 1206/1208. As a result of applying the different voltages depicted in FIG. 16A and FIG. 16B, the three tiers erase at the same speed. FIG. 16C depicts an alternative that includes applying the control gate voltage as a function (e.g., Equation A) of word line position to create a continuous gradient.

A non-volatile memory system has been disclosed that concurrently erases the three or more tiers using a GIDL erase process that transfers holes from outer tiers to inner tiers through the joint regions including compensating for intrinsic erase speed differences between the tiers to achieve uniform erase speed for the three or more tiers.

One embodiment includes a non-volatile storage apparatus comprising a plurality of non-volatile memory cells divided into three or more tiers and a control circuit connected to the non-volatile memory cells. The three or more tiers comprise outer tiers and one or more inner tiers. The control circuit is configured to erase the non-volatile memory cells by applying a larger voltage bias to control gates of non-volatile memory cells in the outer tiers than a voltage bias applied to control gates of non-volatile memory cells in the one or more inner tiers.

In one example implementation, the plurality of non-volatile memory cells divided into five tiers with a joint region between each pair of neighboring tiers; the five tiers include two outer tiers and three inner tiers; the three inner tiers include two intermediate tiers and one center tier; the control circuit is configured to erase the non-volatile memory cells by applying a first voltage bias to control gates of non-volatile memory cells in the outer tiers, a second voltage bias to control gates of non-volatile memory cells in the intermediate tiers, and a third voltage bias to control gates in the center tier; the first voltage bias is greater than the second voltage bias; and the second voltage bias is greater than the first voltage bias.

One embodiment includes a method of erasing non-volatile storage, comprising: applying an erase voltage to both ends of groups of connected non-volatile memory cells that are divided into three or more tiers with a joint region between each pair of neighboring tiers; applying enabling voltages to select gates at both ends of the groups of connected non-volatile memory cells; applying a first voltage to control gates of non-volatile memory cells in a first set of tiers physically closer to the select gates; and applying a second voltage to control gates of non-volatile memory cells in a second set of one or more tiers physically farther from the select gates than the first set of tiers, the first voltage is larger than the second voltage.

One embodiment includes a non-volatile storage apparatus comprising a block of non-volatile memory cells arranged as NAND strings and divided into three or more tiers with a joint region between each pair of neighboring tiers and means for concurrently erasing the three or more tiers using a Gate Induced Drain Leakage erase process that transfers holes from outer tiers to inner tiers through the joint regions including compensating for intrinsic erase speed differences between the tiers to achieve uniform erase speed for the three or more tiers.

Figure 9:
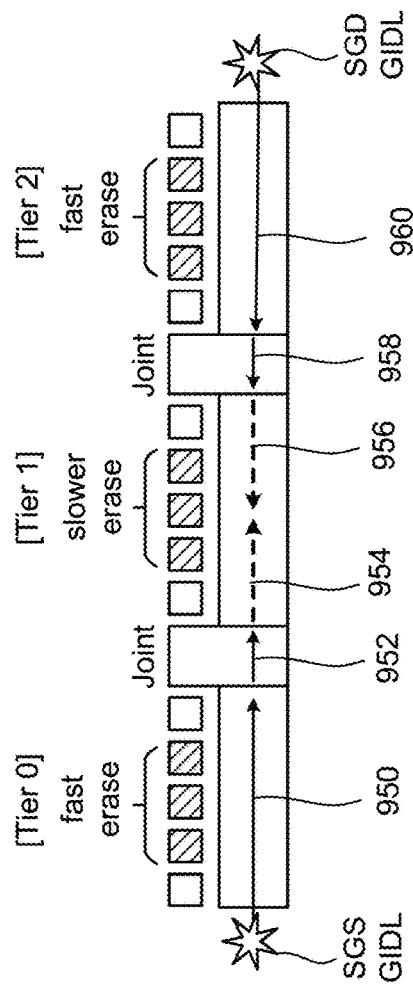
FIG. 9A depicts three tiers of a memory hole.
FIG. 9B depicts five tiers of a memory hole.

Examples of the means for concurrently erasing includes any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits (including hardware only or a combination of hardware and software/firmware) performing the processes of FIGS. 9, 10 and/or 11 (including the GIDL erase of FIGS. 7 and 8).

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a plurality of non-volatile memory cells divided into three or more tiers by a joint region between each pair of neighboring tiers, the three or more tiers comprise outer tiers and one or more inner tiers, each tier of the three or more tiers comprises multiple consecutively connected non-volatile memory cells with no intervening joint region; and
   a control circuit connected to the non-volatile memory cells, the control circuit is configured to concurrently erase the non-volatile memory cells in the three or more tiers by applying a larger voltage bias to control gates of non-volatile memory cells in the outer tiers than a voltage bias applied to control gates of non-volatile memory cells in the one or more inner tiers such that for each joint region between neighboring tiers control gates of all and multiple non-volatile memory cells on a first side of the respective joint region receive a different voltage bias than control gates of all and multiple non-volatile memory cells on a second side of the respective joint region to cause erasing on both sides of the respective joint region.

2. The non-volatile storage apparatus of claim 1, wherein:
   the control circuit is configured to concurrently erase the non-volatile memory cells of the three or more tiers using a Gate Induced Drain Leakage erase process that transfers holes from outer tiers to one or more inner tiers through the joint regions by applying a larger voltage bias to control gates of non-volatile memory cells in the outer tiers than a voltage bias applied to control gates of non-volatile memory cells in the one or more inner tiers.

3. The non-volatile storage apparatus of claim 1, further comprising:
   word lines connected to the control circuit and the non-volatile memory cells, the non-volatile memory cells are arranged as NAND strings that each have a channel, the control circuit is configured to apply the larger voltage bias to control gates of non-volatile memory cells in the outer tiers to create a weaker gradient between word lines and the channels for outer tiers as compared to one or more inner tiers.

4. The non-volatile storage apparatus of claim 1, wherein:
   the plurality of non-volatile memory cells are arranged as groups of connected memory cells having two ends;
   the control circuit is configured to applying a larger voltage bias to control gates of non-volatile memory cells in the outer tiers than a voltage bias applied to control gates of non-volatile memory cells in the one or more middle tiers by applying different voltages to control gates of the non-volatile memory cells based on distance to a closest of the two ends.

5. The non-volatile storage apparatus of claim 1, wherein:
   the voltage bias applied to control gates of non-volatile memory cells in the one or more middle tiers is a negative voltage.

6. The non-volatile storage apparatus of claim 1, wherein:
   the control circuit is configured to apply the larger voltage bias to all control gates of the non-volatile memory cells in the outer tiers.

7. The non-volatile storage apparatus of claim 1, wherein:
the plurality of non-volatile memory cells divided into five tiers with a joint region between each pair of neighboring tiers;
the five tiers include two outer tiers and three inner tiers;
the three inner tiers include two intermediate tiers and one center tier;
the control circuit is configured to erase the non-volatile memory cells by applying a first voltage bias to control gates of non-volatile memory cells in the outer tiers, a second voltage bias to control gates of non-volatile memory cells in the intermediate tiers, and a third voltage bias to control gates in the center tier;
the first voltage bias is greater than the second voltage bias; and
the second voltage bias is greater than the third voltage bias.

8. The non-volatile storage apparatus of claim 1, wherein:
the plurality of non-volatile memory cells comprise a block of non-volatile memory cell cells arranged as NAND strings.

9. A method of erasing non-volatile storage, comprising:
applying an erase voltage to both ends of groups of connected non-volatile memory cells that are divided into three or more tiers with a joint region between each pair of neighboring tiers, each tier of the three or more tiers comprises multiple consecutively connected non-volatile memory cells with no intervening joint region;
applying enabling voltages to select gates at both ends of the groups of connected non-volatile memory cells;
applying a first voltage to control gates of non-volatile memory cells in a first set of tiers physically closer to the select gates; and
applying a second voltage, smaller than the first voltage, to control gates of non-volatile memory cells in a second set of one or more tiers physically farther from the select gates than the first set of tiers such that for each joint region between neighboring tiers control gates of all and multiple non-volatile memory cells on a first side of the respective joint region receive a different voltage than control gates of all and multiple non-volatile memory cells on a second side of the respective joint region to cause erasing on both sides of the respective joint region.

10. The method of claim 9, wherein:
the groups of connected non-volatile memory cells comprise a block of non-volatile memory cell cells arranged as NAND strings and divided into three or more tiers with a joint region between each pair of neighboring tiers; and
the applying the first voltage is performed concurrently with the applying the second voltage during a Gate Induced Drain Leakage erase process that transfers holes from outer tiers to inner tiers through the joint regions including compensating for intrinsic erase speed differences between the tiers to achieve uniform erase speed for the three or more tiers.

11. The method of claim 9, further comprising:
applying a third voltage to control gates of non-volatile memory cells in a third set of one or more tiers physically farther from the select gates than the second set of one or more tiers, the second voltage is larger than the third voltage.

12. The method of claim 9, wherein:
the second voltage is a negative voltage.

* * * * *